United States Patent [19]

Beebe et al.

[11] Patent Number: 5,867,507
[45] Date of Patent: Feb. 2, 1999

[54] TESTABLE PROGRAMMABLE GATE ARRAY AND ASSOCIATED LSSD/DETERMINISTIC TEST METHODOLOGY

[75] Inventors: Wayne Kevin Beebe, Essex Junction; Sally Botala, Westford; Scott Whitney Gould, Burlington; Frank Ray Keyser III, Colchester; Wendell Ray Larsen, Essex Junction; Ronald Raymond Palmer, Westford; Brian Worth, Milton, all of Vt.

[73] Assignee: International Business Machines Corporation, Armonk, N.Y.

[21] Appl. No.: 570,846

[22] Filed: Dec. 12, 1995

[51] Int. Cl.[6] .................................................... G01R 31/28
[52] U.S. Cl. ................................... 371/22.31; 395/183.06
[58] Field of Search .................................. 371/22.3, 22.2,
371/22.1, 22.5, 25.1, 22.31, 22.32, 22.34,
27.5, 27.7; 364/488, 489, 490; 326/16,
37–39; 307/465; 395/183.06, 183.19; 324/765

[56] References Cited

U.S. PATENT DOCUMENTS

| | | | |
|---|---|---|---|
| 3,783,254 | 1/1974 | Eichelberger | 235/152 |
| 4,461,001 | 7/1984 | Bossen et al. | 371/38 |
| 4,817,093 | 3/1989 | Jacobs et al. | 371/25 |
| 4,855,669 | 8/1989 | Mahoney | 324/73 R |
| 4,980,889 | 12/1990 | DeGuise et al. | 371/22.3 |
| 5,221,865 | 6/1993 | Philips et al. | 307/465 |
| 5,278,841 | 1/1994 | Myers | 371/20.6 |
| 5,285,453 | 2/1994 | Gruodis | 371/27 |
| 5,301,156 | 4/1994 | Talley | 365/201 |
| 5,325,367 | 6/1994 | Dekker et al. | 371/21.1 |
| 5,329,471 | 7/1994 | Swoboda et al. | 364/296.3 |
| 5,347,519 | 9/1994 | Cooke et al. | 371/22.2 |
| 5,369,646 | 11/1994 | Shikatani | 371/22.5 |
| 5,550,843 | 8/1996 | Yee | 371/22.3 |

OTHER PUBLICATIONS

Eichelberger, E. & Williams, T., "A Logic Design Structure for LSI Testability," The Proceedings of the 14th Design Automation Conference, 1977, pp. 206–211.

*Primary Examiner*—Albert DeCady
*Assistant Examiner*—Nadeem Iqbal
*Attorney, Agent, or Firm*—Heslin & Rothenberg, P.C.

[57] ABSTRACT

A programmable gate array includes test subsystems for testing various functional subsystems of the programmable gate array. A sequence of test methods, employing the test subsystems, test the functionality of the programmable gate array, taking into account the interdependencies of the various subsystems and accordingly enabling fault isolation therein.

23 Claims, 21 Drawing Sheets

ASSEMBLE FIG. 1 AS FOLLOWS:

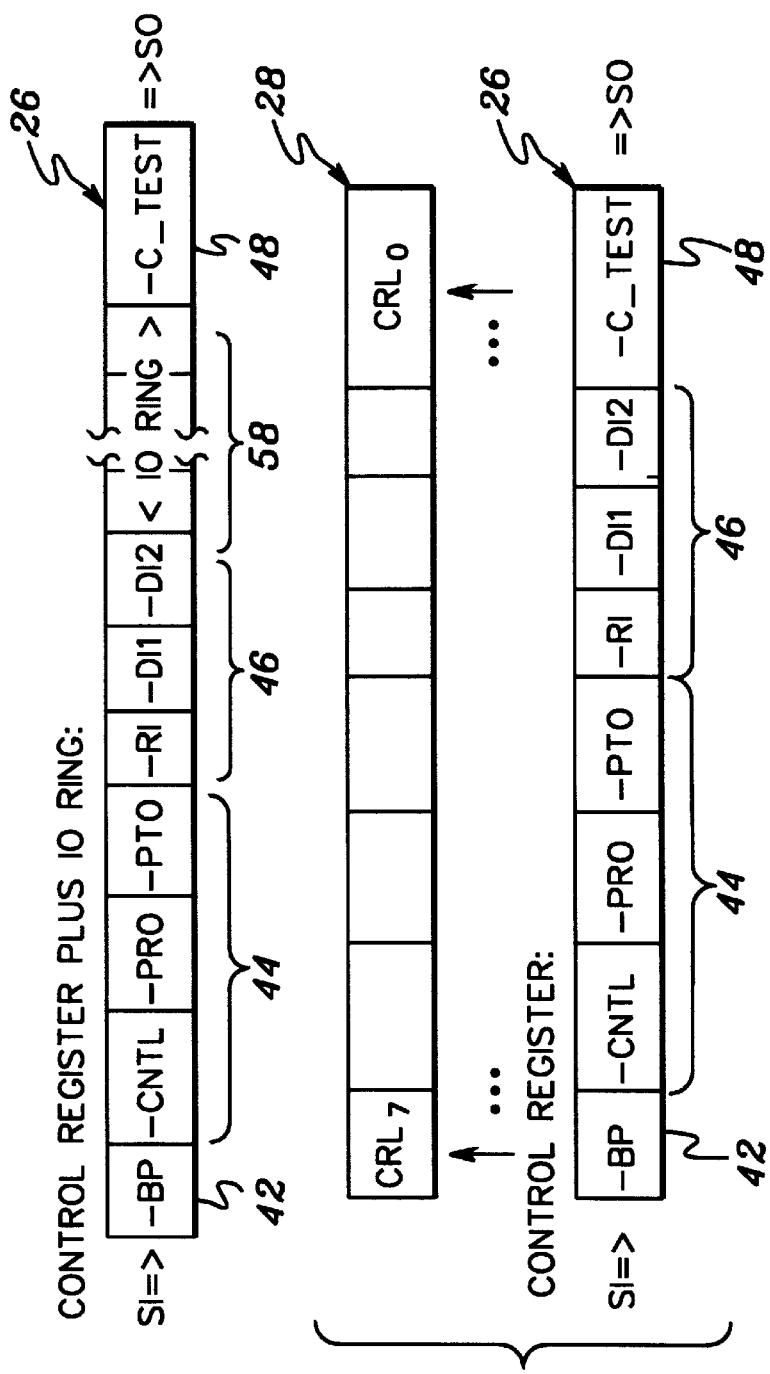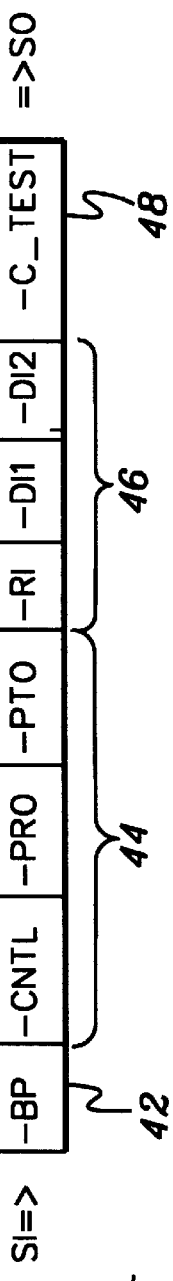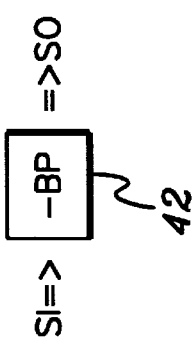

ASSEMBLE FIG. 6 AS FOLLOWS:
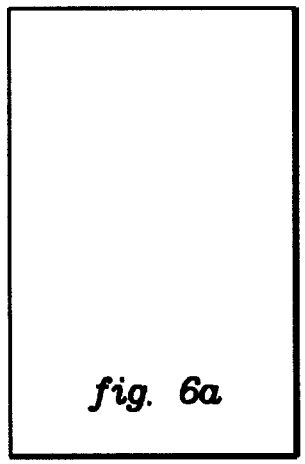
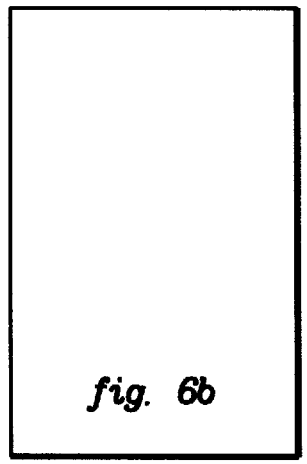

ASSEMBLE FIG. 7 AS FOLLOWS:
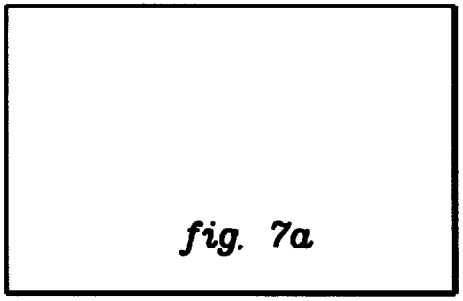
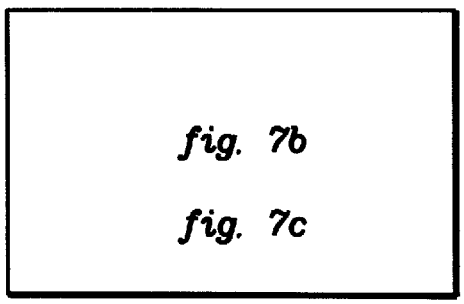

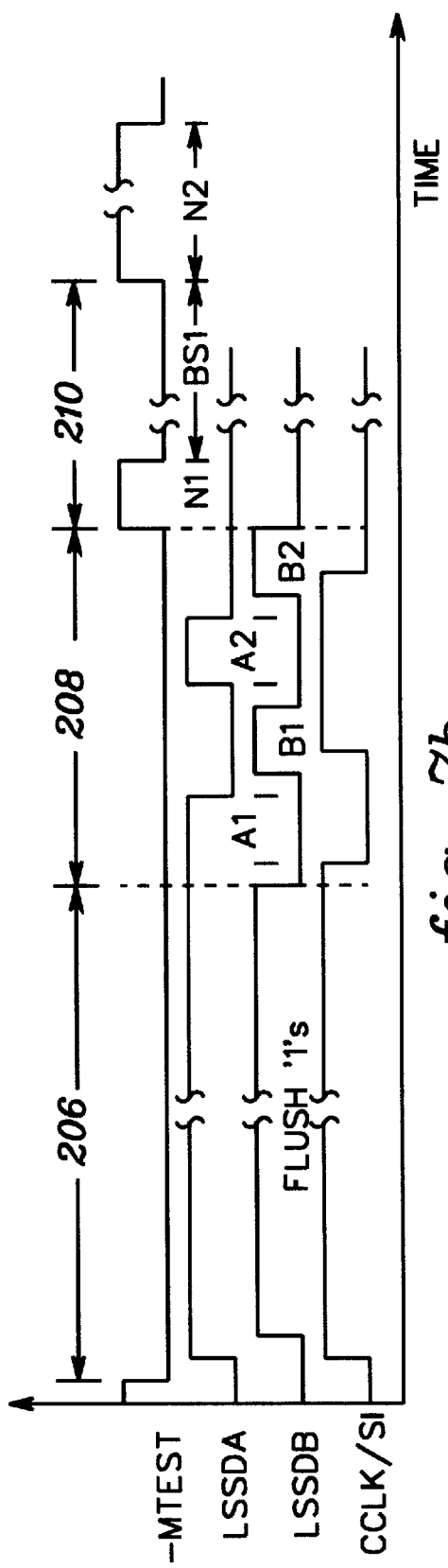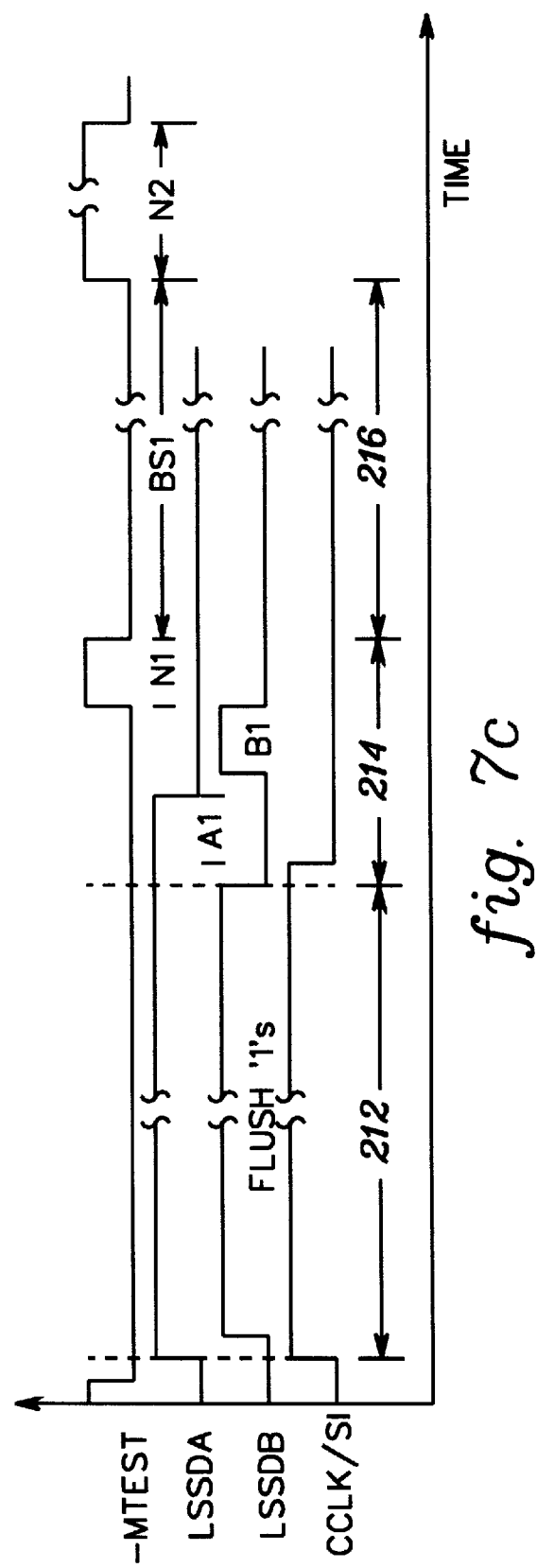

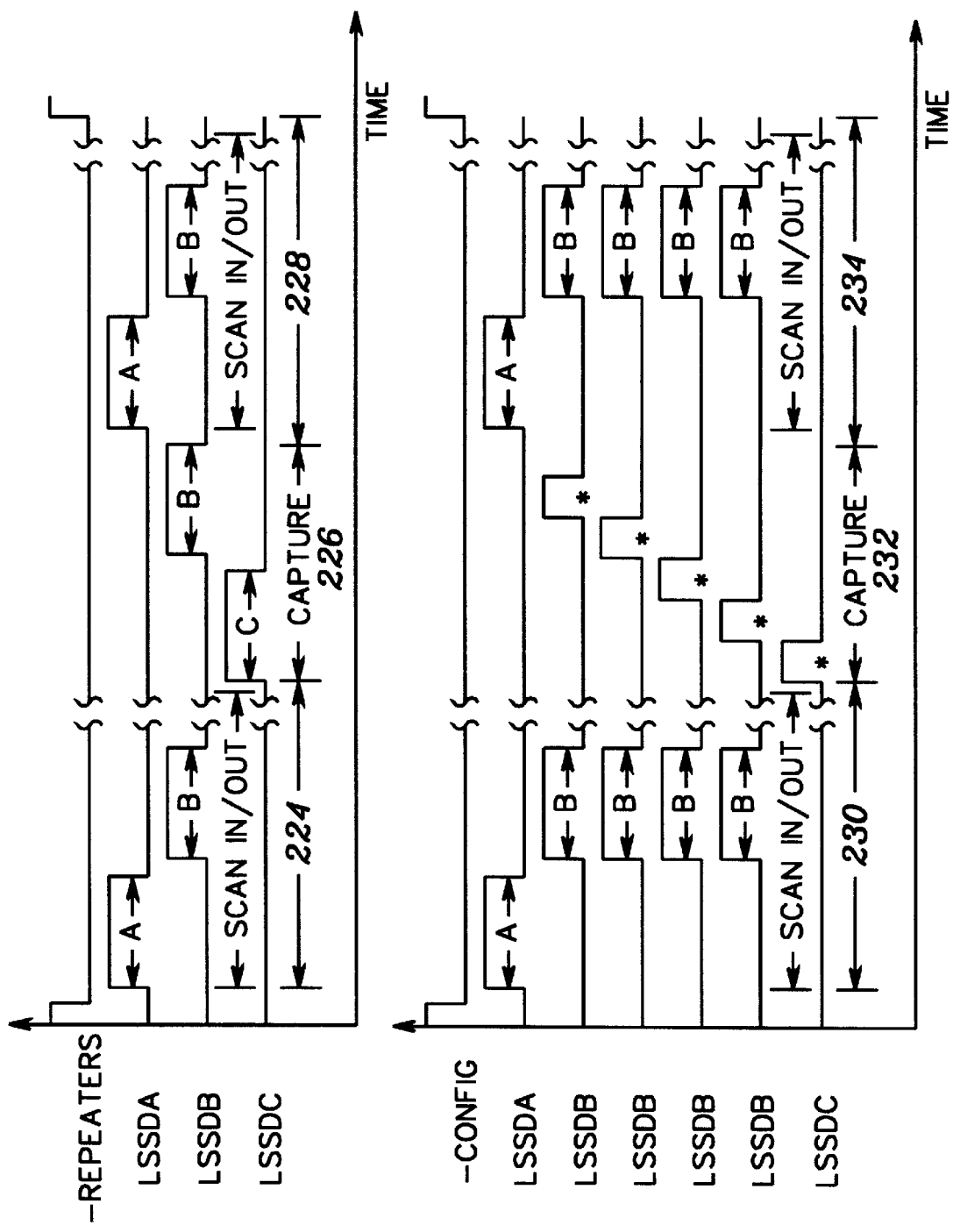

TESTABLE PROGRAMMABLE GATE ARRAY AND ASSOCIATED LSSD/DETERMINISTIC TEST METHODOLOGY

RELATED APPLICATION INFORMATION

This application relates to commonly owned previously filed U.S. Patent Applications:

1. Ser. No. 08/459,579, filed Jun. 2, 1995, entitled "PROGRAMMABLE ARRAY INTERCONNECT NETWORK";

2. Ser. No. 08/460,420, filed Jun. 2, 1995, entitled "PROGRAMMABLE ARRAY I/O—ROUTING RESOURCE";

3. Ser. No. 08/459,156, filed Jun. 2, 1995, entitled "PROGRAMMABLE ARRAY CLOCK/RESET RESOURCE";

4. Ser. No. 08/460,481, filed Jun. 2, 1995, entitled "PROGRAMMABLE LOGIC CELL";

5. Ser. No. 08/480,639, filed Jun. 7, 1995, entitled "PROGRAMMABLE ARRAY INTERCONNECT LATCH"; and 6. Ser. No. 08/488,314, filed Jun. 7, 1995 entitled "CONTINUOUS ADDRESS STRUCTURE WITH FOLDING."

Each of these applications is hereby incorporated by reference herein in its entirety.

Technical Field

The present invention relates to test subsystems and strategies for testing semiconductor integrated circuits, and in particular to test subsystems and strategies for testing field programmable gate arrays.

Background Of The Invention

Field programmable gate arrays (FPGAs) are known to those skilled in the art to include arrays of uncommitted, programmable logic cells having both combinational and synchronous logic circuits therein. Typically, the logic cells are programmably interconnected by a programmable interconnect network. A complex user-defined logic function can thus be performed by an FPGA by appropriately programming and interconnecting the logic cells.

Advanced FPGAs may also include programmable input/output (I/O) resources for transferring data to and from the array of logic cells. The I/O resources may be programmable to control the direction of signal propagation therethrough (i.e. either input or output), and may additionally be programmed per several additional selectively activated control configurations (e.g., impedance, slew rate, pull-ups, polarity, etc.). FPGAs often employ many I/O terminals, each of which may be individually configured per its associated programmable I/O resources. Programmable clock networks may also be employed in an FPGA to distribute one or a plurality of clock signals to various sequential circuits of the array. Each of the above FPGA subsystems is normally considered part of a "functional" portion of an FPGA. These subsystems are referred to hereinafter singly or collectively, as "programmable resources." Exemplary programmable resources are disclosed in the above identified co-pending U.S. Patent Applications.

A variety of programming technologies are currently available for FPGAs. For example, non-volatile fuse or anti-fuse links can be employed in the array to provide selective connection between array resources. To program these lines, each terminal of each two-terminal link must be independently addressable for enabling selective placement of appropriate programming voltages across the link. Thus, additional configuration support circuitry is necessary to provide the requisite addressing and routing of the programming voltages for configuring the array. Floating-gate EPROM/EEPROM transistors can also be used to provide array programmability, and would be similarly placed in the array and independently addressed for applying programming voltages thereto.

Static RAM (SRAM) technologies are also available for controlling the programmable resources of a FPGA. A simple programmable resource of the FPGA includes a CMOS pass gate. The pass gate is controlled by an underlying SRAM cell which holds a predetermined programmed state. This programmed state, i.e. configuration data bit as stored in the SRAM cell, determines whether the pass gate conducts. A homogeneous array of SRAM cells can thus be provided as a relatively independent subsystem in an FPGA for establishing the configurations of the associated programmable resources of the FPGA. Access to the array of SRAM cells is provided using standard access techniques controlled by a configuration logic subsystem of the FPGA.

It is thus apparent that, in addition to the programmable resources of a programmable gate array, additional configuration subsystems are necessary for enabling programming of the array. In the above SRAM FPGA example, a homogeneous array of SRAM cells is provided for configuring associated programmable resources of the FPGA, along with associated configuration logic for controlling access thereto. From the standpoint of semiconductor design and fabrication, the provision of multiple, heterogeneous subsystems in a single semiconductor package leads to serious concerns regarding circuit testability, including fault detection and isolation. It would thus be advantageous to provide a comprehensive test strategy for enabling testing of the configuration subsystems and programmable resources of an FPGA. This test strategy itself may include the provision of additional test subsystems within the FPGA, which test subsystems should also be testable. Thus, the test strategies, to the extent possible, must encompass all of the resources and subsystems of the FPGA, including the test subsystems.

The programmable resources, and the configuration and test subsystems, though different in their respective circuitry and functions, are nevertheless highly interdependent. This interdependence significantly complicates the test strategies employed. For example, it is often desirous to test the combinational logic of the logic cells, which logic cells are programmed into a given state by the configuration subsystem. The integrity of the logic cell tests, however, may be adversely influenced by errors in the configuration subsystems, and by errors in the test subsystems. Thus, it is desirous to employ a test strategy which considers, to the extent possible, the interdependence between the various resources and subsystems in an FPGA.

Known boundary scan techniques involve the provision of dual latch sets, e.g. LSSD registers, at the perimeter of a chip, in association with the I/O terminals thereof. The latch sets are interconnected as a shift register scan chain. Test stimuli can be loaded serially into the scan chain and applied to an internal circuit of the chip. The scan chain can likewise capture result data as provided by the internal circuit in response to the test stimuli. These results can then be shifted out of the shift register and compared to expected results. Scan-in, scan-out, and several clock terminals of the chip are provided for enabling operation of the scan chain. Accordingly, faults can be detected in the internal circuit of the chip without requiring external test interfacing to each I/O terminal of the chip. However, with increasing circuit densities, and especially considering the heterogeneous nature of the circuits in an FPGA, fault detection may be possible with boundary scan techniques, but fault isolation may be difficult. It is thus desirous to employ test subsystems which provide a greater degree of fault isolation during testing of the various resources and subsystems in an FPGA.

Level-sensitive scan design (LSSD) test techniques are also known and involve segmenting a logic circuit into combinational and synchronous logic circuitry. The synchronous circuits are connected into a serial shift register scan chain which bound or segment regions of the logic circuitry. Like the boundary scan techniques, test stimuli are shifted into the shift register scan chain and applied to the logic circuit. Result data is captured into the scan chain as effected by the associated logic circuitry or segment thereof. The captured result data is then shifted out for analysis. Again, reduced pin count testing is achieved in that external test equipment need only access the scan-in, scan-out and appropriate clock pins.

In typical FPGAs, it is somewhat difficult to clearly segment all of the combinational circuits by converting the synchronous circuits thereof into serial shift registers. For example, if each of the synchronous circuits in each logic cell is converted and connected within an associated serial shift register scan chain, the intervening programmable interconnect network would not be clearly segmented and would likely contain untestable regions. This problem is especially severe if the interconnect network is large and complex. Thus, it is desirous to provide a test strategy which provides adequate testing of the heterogeneous combinational and synchronous resources of an FPGA, enables ready segmentation thereof and overcomes the weakness of using a pure LSSD approach.

The provision of a high performance test strategy as discussed above, may require at least some additional test subsystems in the array. However, like the known shift register techniques, it is desirous to minimize, to the extent possible, the number of I/O terminals necessary to operate the test subsystems. Additionally, it is desirous to support testing of multiple FPGA chips in a system with a minimum amount of signal interface circuitry and external test equipment.

SUMMARY OF THE INVENTION

Accordingly, it is an object of the present invention to provide an improved testable programmable gate array and method for testing the same.

It is a further object of the present invention to provide a comprehensive test strategy for testing a programmable gate array that enables isolation of faults within the various subsystems of the field programmable gate array.

It is yet another object of the present invention to provide such a test strategy for testing a programmable gate array, which test strategy takes into account interdependencies between the various subsystems of the programmable gate array.

It is a further object of the present invention to provide such a testable programmable gate array and associated test methods for enabling testing of multiple programmable gate arrays.

In accordance with a first embodiment of the present invention, a field programmable gate array has a plurality of functional signal lines coupled to associated I/O ports. A plurality of programmable logic units provides particular logic circuits in accordance with associated logic configuration data. A plurality of programmable interconnects interconnect the functional signal lines and programmable logic units in accordance with associated routing configuration data. Memory cells associated with the programmable logic units and programmable interconnects retain logic and routing configuration data respectively for configuring the associated programmable resources. Configuration logic receives memory request signals and processes these signals for enabling access to the memory cells. Test circuitry of the FPGA includes an LSSD boundary scan chain across the functional signal lines of the FPGA for enabling selective serial scan access to, and functional verification of, the I/O functional signal lines and associated I/O ports. A second LSSD scan chain is associated with the configuration logic for enabling LSSD serial scan access and testing thereof. Finally, LSSD repeater scan chains are disposed along the programmable interconnects of the field programmable gate array for enabling selective serial scan access thereto.

In one aspect of this first embodiment of the present invention, the I/O boundary scan chain includes a portion associated with loading data into a test control register for providing control signals for controlling various features of the FPGA.

A further aspect of this first embodiment of the present invention includes provisions for supporting an array test mode. The plurality of programmable operating units are disposed across the FPGA as an array of rows and columns. The programmable interconnects comprise multiple row buses and multiple column buses disposed across the array proximate associated rows and columns of the programmable operating units. Programmable repeater units selectively subdivide given buses of the row buses and column buses into associated bus segments in accordance with repeater configuration data as retained in designated memory cells of the configuration memory. Each LSSD scan register of the repeater scan chains is incorporated within an associated repeater unit of the plurality of programmable repeater units. Preferably, the LSSD scan registers of the associated row buses and column buses are serially connected to provide the respective repeater scan chains.

In a first test method (B/S or Card test) of the present invention, a method is provided for testing an FPGA having an I/O boundary scan chain around an I/O boundary thereof. In a first test macro, known I/O test data is applied to the I/O boundary of the FPGA. Next, data of the I/O boundary is latched into the I/O boundary scan chain. This latched data is then scanned out of the I/O boundary scan chain and recovered for comparison with the known I/O test data for determining functionality of the I/O boundary of the FPGA.

In a second test method (configuration or LSSD test), the FPGA is provided with a configuration scan chain for testing configuration logic of the FPGA. A configuration test vector is scanned into the configuration scan chain and applied to the configuration logic. Result data, as effected by the configuration logic in response to the applied configuration test vector, is latched into the configuration scan chain. The result data is then scanned out of the configuration scan chain, recovered and compared with predetermined result data, per the applied test vector and the configuration logic, for determining functionality of the configuration logic.

In a third test method (array test), the FPGA is provided with repeater scan chains configured within select programmable interconnects of the FPGA. A first set of interconnects of the programmable interconnects of the FPGA are configured between respective LSSD scan registers of input and output repeater scan chains of the repeater scan chains. An interconnect test vector is serially scanned into the input repeater scan chain and applied to an input side of the first set of interconnects. Result data at an output side of the first set of interconnects is then latched into the output repeater scan chains. The result data is then scanned out of the output repeater scan chain, recovered and compared to the applied interconnect test vector for determining functionality of the programmable interconnects.

Another test method of this embodiment (Configuration Memory Access Test) directly accesses and tests memory cells of the FPGA for determining the ability of the memory cells to receive and retain configuration data for configuring the programmable resources of the FPGA. First, known data is written into the memory cells. Next, data is retrieved from the memory cells and compared to the known data for determining functionality of the memory cells.

In a further test method of the present invention, a method is provided for testing configurability of an FPGA. An FPGA is provided having a plurality of I/O ports, programmable logic units, and programmable interconnects for interconnecting the programmable logic units and I/O ports. A plurality of configuration memory cells are designated to the various programmable logic units and programmable interconnects. The configuration memory cells retain configuration data for configuring the programmable logic units and programmable interconnects. Configuration logic is provided with the FPGA for enabling access to, and loading of configuration data into, the programmable memory cells. In this method of testing the field programmable gate array, functionality of the configuration logic is tested via a LSSD scan chain associated with the configuration logic. After testing the configuration logic, the plurality of configuration memory cells are tested using deterministic test patterns.

In a further aspect of the previous method of testing of the present invention, a boundary scan chain is employed for observation of the state the I/O ports of the FPGA (snapshot).

In a fourth test method (B/S chip test) of the present invention, a method is provided for testing an FPGA having a plurality of I/O pins, a plurality of I/O functional signal lines, a plurality of programmable logic units, and a plurality of programmable interconnects for selectively interconnecting the functional signal lines and select programmable logic units in accordance with routing configuration data. The FPGA is provided with a plurality of memory cells for retaining configuration data associated with configuring the programmable resources of the FPGA. Configuration logic of the FPGA enables access to the memory cells. A boundary scan chain is provided across the functional signal lines of the FPGA and a configuration scan chain is provided about and within the configuration logic. Repeater scan chains are provided along select interconnects of the programmable interconnects. The repeater scan chains are selectively coupled to associated interconnects in accordance with respective latch configuration data.

In testing the FPGA in accordance with this fourth test method of the present invention, each of the various scan chains are tested by scanning data serially therethrough. Data is received as passed through the scan chains and compared with that scanned in for determining functionality of the respective scan chains.

The I/O functional signal lines and associated functional I/O pins are tested by applying a test vector to the functional I/O pins and latching result data of the I/O functional lines into the boundary scan chain. The result data is scanned out of the boundary scan chain and compared with the test vector as applied to the functional I/O pins for determining functionality of the I/O pins and associated functional signal lines.

In a further procedure of this fourth test method, the configuration logic is tested by scanning a test vector serially into the configuration scan chain and applying the test vector to the associated configuration logic. Result data, effected by the configuration logic in response to the applied test vector, is then latched into the configuration scan chain. This result data is serially scanned out of the configuration scan chain and compared to predetermined result data, which has been predetermined in accordance with the applied test vector and the associated configuration logic, for determining proper operation of the configuration logic.

The programmable interconnects are tested by first configuring a first set of interconnects of the plurality of programmable interconnects between first and second repeater scan chains. A test vector is scanned serially into the first repeater scan chain. The first repeater scan chain is configured, per appropriate configuration data, to apply the test vector to the input sides of the first set of interconnects. Data at the output sides of the first set of interconnects is then latched into the second repeater scan chain. This result data is scanned out of the second repeater scan chain, recovered and compared with the applied test vector for determining proper functionality of the programmable interconnects.

In a final embodiment of the present invention, a field programmable gate array includes configuration logic for accessing memory cells thereof, which memory cells are associated with configuring programmable resources of the FPGA. An LSSD scan chain is associated with the configuration logic for enabling LSSD access and testing of the configuration logic.

BRIEF DESCRIPTION OF THE DRAWINGS

The subject matter which is regarded as the invention is particularly pointed out and distinctly claimed in the concluding portion of the specification. The invention, however, both as to organization and method of practice, together with further objects and advantages thereof, may best be understood by reference to the following detailed description of preferred embodiments and the accompanying drawings in which:

FIG. 5a is a block diagram illustrating a particular portion of the I/O boundary scan chain of FIG. 2 as associated with loading a control register for providing control signals for configuring and testing the field programmable gate array;

FIG. 5b is a block diagram illustrating an alternative configuration of the I/O boundary scan chain consisting only of that portion associated with loading the control register of the field programmable gate array;

FIG. 5c is a block diagram illustrating another alternative reduced I/O boundary scan chain configuration consisting of only a single bit bypass register;

FIG. 7b is a timing diagram representative of signals associated with operating the I/O boundary scan chain for loading the control register portion only;

FIG. 7c is a timing diagram representative of signals associated with operating a further reduced I/O boundary scan configuration consisting of the single bit bypass register only;

FIG. 13 is a timing diagram showing a control signal and associated scan clocks for operating repeater scan chains of a programmable gate array during interval T of FIG. 12;

FIG. 14 is a timing diagram showing a control signal and associated clocks for operating a configuration scan chain of a programmable gate array during interval T of FIG. 12;

DESCRIPTION OF THE PREFERRED EMBODIMENT(S)

The present invention provides test subsystems and strategies for testing a programmable gate array. The following description first describes the basic structure of a programmable gate array and its associated test subsystems. Next, test macros and associated sequences are described for testing the programmable gate array per its associated test sub systems.

The test subsystems and methods of the present invention are described hereinafter with reference to an exemplary field programmable gate array. It is noted that the test subsystems and methods of the present invention could be similarly applied to other comparable reconfigurable logic devices.

Figure 1A:
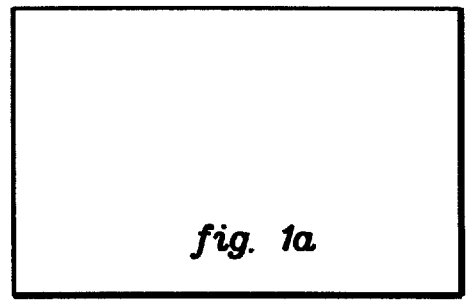
FIGS. 1a–b are a block diagram of a field programmable gate array in accordance with the present invention.
Figure 1B:
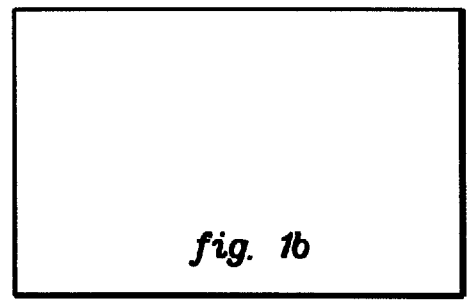
Figure 1A:
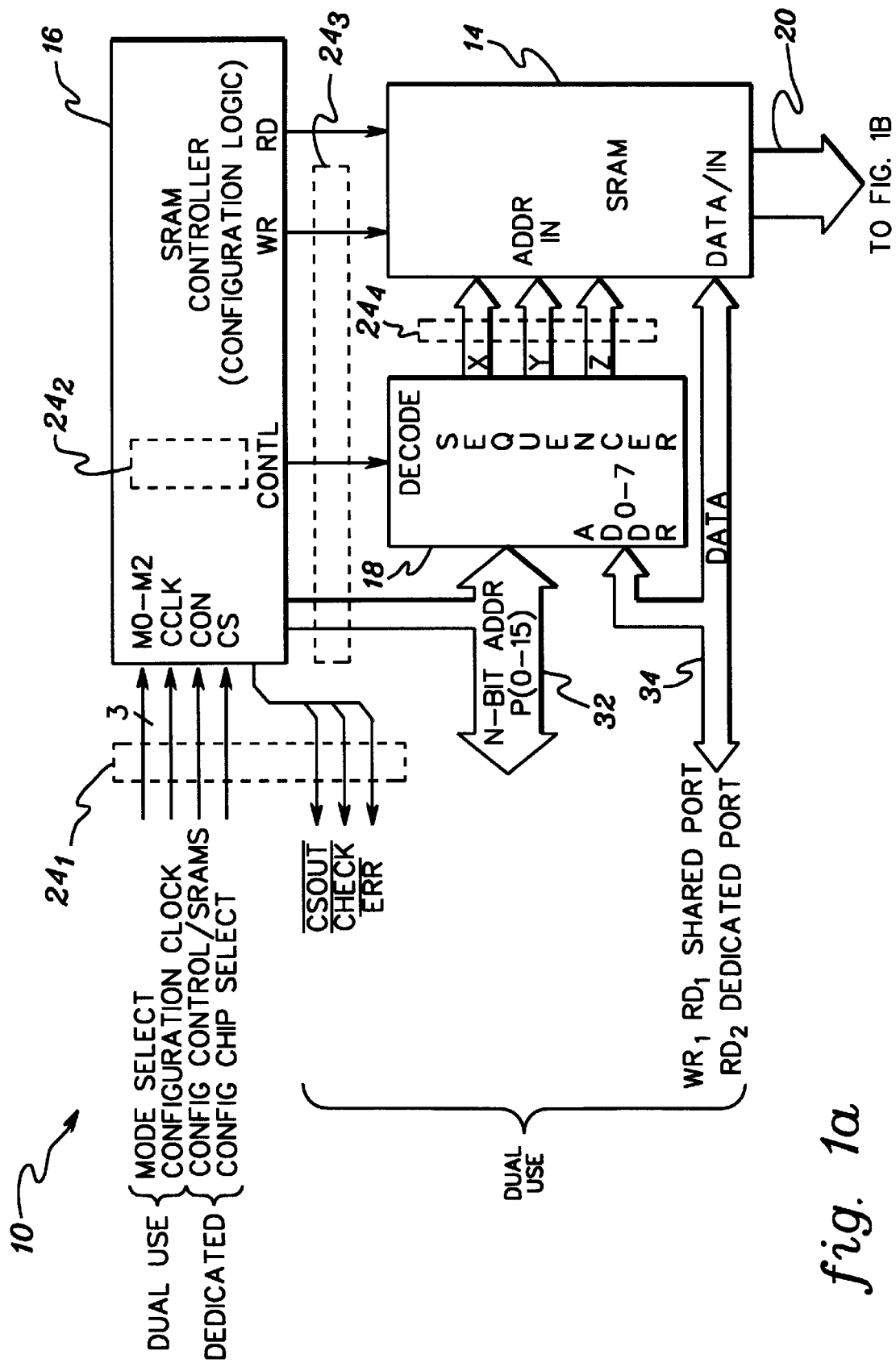
Figure 1B:
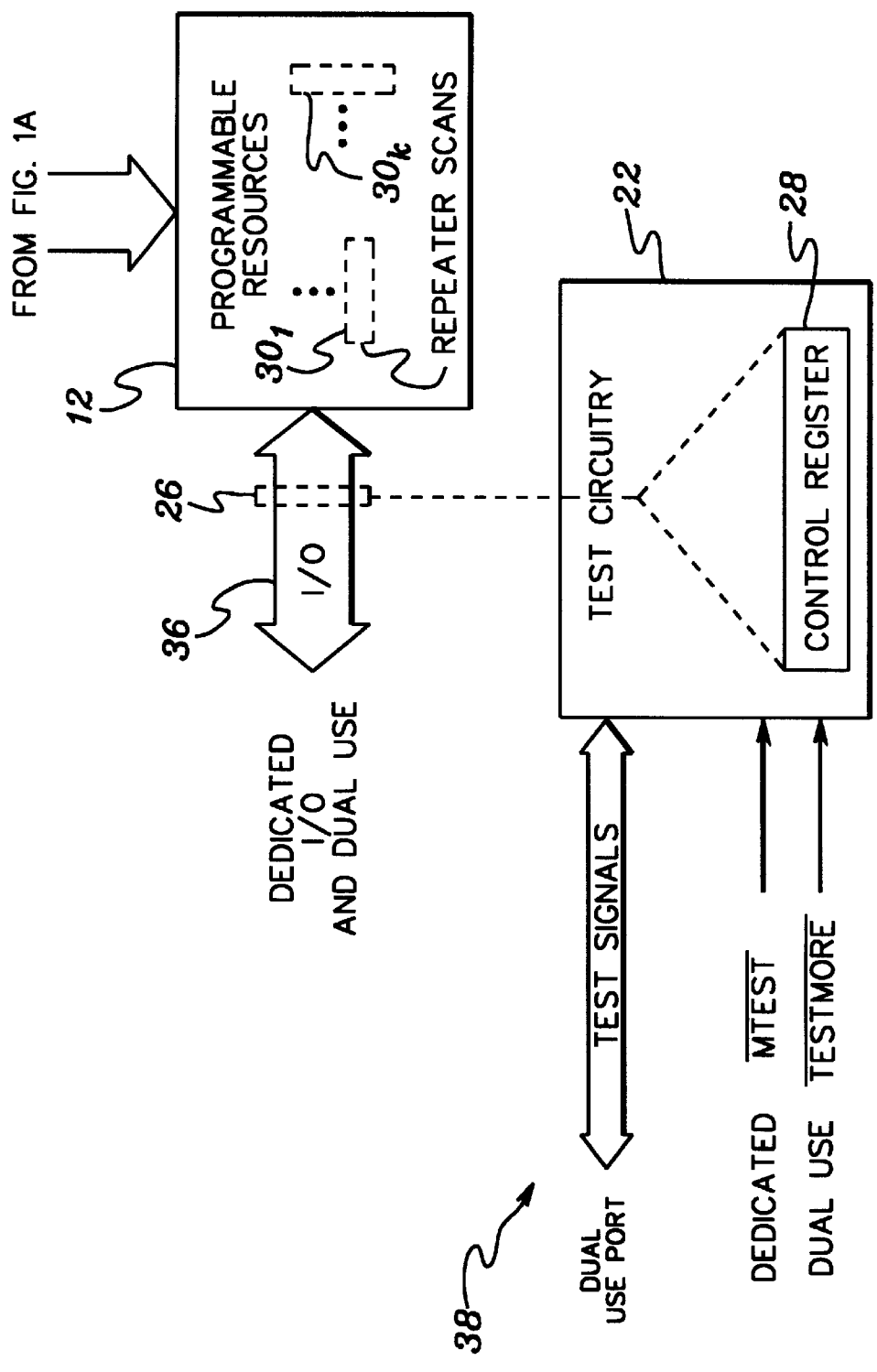

Overview of an FPGA:

With reference to FIGS. 1a–b, a field programmable gate array 10 is shown and includes a variety of subsystems for enabling testing, configuration, and functional operation of complex user defined logic circuits. Programmable resources 12 of the field programmable gate array (FPGA) 10 include programmable logic cells, programmable interconnect networks, programmable clock/reset distribution networks, programmable input/output ports and others. Further description of a programmable logic cell is provided in the above incorporated portions of the U.S. Patent Application entitled "Programmable Logic Cell." Likewise, further description of the interconnect network, clock/reset distribution and programmable input/output resources are provided in the above incorporated portions of the respective U.S. Patent Applications entitled "Programmable Array Interconnect Network," "Programmable Array Clock/Reset Resource," and "Programmable I/O Routing Resource." SRAM 14 of FPGA 10 retains the configuration data for selectively driving the configuration states of the various programmable resources 12 of FPGA 10. Configuration program bits 20 drive the various programmable resources 12 of the FPGA in accordance with the configuration data of associated memory cells of SRAM 14. The above incorporated portions of the U.S. Patent Application entitled "Continuous Address Structure With Folding" provide an exemplary illustration of the allocation of SRAM memory to the various programmable resources of an FPGA.

Configuration logic 16 and 18 of FPGA 10 access SRAM 14 for enabling loading of configuration data therein so as to configure programmable resources 12, and also for permitting testing of SRAM 14. SRAM controller 16 of the configuration logic receives various input signals for selecting operating modes and controlling access to SRAM 14. SRAM controller 16 also provides output signals during operational verification of SRAM 14. Further description of configuration logic 16 may be found in U.S. Pat. No. 5,298,805, issued on Mar. 29, 1994 to Garverick et al., entitled "Versatile and Efficient Cell-to-Local Bus Interface in a Configurable Logic Array," and in the publication entitled "Application Note AT6000 Series Configuration," May 19, 1993, revision 1B, Atmel Corporation. Both of these references are hereby incorporated by reference herein in their entirety.

Decoder and sequencer 18 of the configuration logic receives data from address bus 32 and/or data bus 34. The decoder and sequencer decodes this data to provide addresses and/or address sequences for addressing the memory map of SRAM 14. Further description of the decoder and sequencer can be obtained in the above incorporated portions of the U.S. Patent Application entitled "Continuous Address Structure With Folding," and in the publication entitled "Application Note AT6000 Series Configuration."

The subsystems described above—programmable resources 12, SRAM 14, and configuration logic 16,18—enable user functional operation of the FPGA. In the next portion of this disclosure, test subsystems of the FPGA are described for enabling a user to test the various subsystems of the FPGA.

Test Subsystems of a Testable FPGA:

Test circuitry 22, with reference to FIG. 1b, receives test control signals MTEST and TESTMORE for selecting test modes of the FPGA. In addition, additional test signals 38 can be provided to test circuitry 22 for communicating further aspects of individual tests of the FPGA. I/O boundary scan chain 26 provides a known I/O boundary scan chain across functional I/O interconnects 36 of FPGA 10. A portion of this I/O boundary scan chain 26 is associated with loading control register 28 for providing additional control signals during testing of the FPGA.

An additional test subsystem includes configuration scan chain 24. Configuration scan chain 24 bounds various segments of the configuration logic of the FPGA for permitting scan chain access into the configuration logic, enabling testing thereof. Finally, repeater scan chains $30_1, 30_2, \ldots$ provide configurable scan chains within select programmable interconnects of the FPGA. The repeater scan chains provide selective scan chain access to associated programmable interconnects, enabling isolated testing of various portions of programmable resources 12 of the FPGA. Further information regarding the repeater scan chains may be found in the above incorporated portions of the U.S. Patent Application entitled "Programmable Array Interconnect Latch."

FPGA Functional, Configuration and Test Interfacing:

FPGA 10, as shown in FIGS. 1a–b, includes a number of I/O ports and I/O interconnects for propagating signals to or from the various subsystems of the FPGA. In a particular embodiment of the FPGA, some of the I/O interconnects share a common I/O port. These dual use I/O ports are coupled selectively to one of the associated I/O interconnects in accordance with certain test control signals. Table 1, as provided herebelow, shows an allocation of I/O ports of an FPGA to associated I/O interconnects in accordance with the operating mode of the FPGA.

The I/O ports comprise three categories: dedicated "d", multiple use "m", and functional boundary scan "bs" ports. A dedicated I/O port "d", although it may be a dual use port, is always dedicated to nonfunctional aspects of the FPGA— e.g., testing, configuration, power up and mode selection.

The multiple use I/O ports "m" are dual use ports coupled selectively to functional interconnects of the FPGA, or alternatively to expanded test interconnects. In certain test modes, the multiple use I/O ports "m" provide an expanded test interface.

The boundary scan I/O ports "bs" are predominantly allocated to functional interconnects of the FPGA. However, a first portion of the boundary scan I/O ports "bs" may be alternatively coupled to interconnects associated with configuration of the FPGA. In addition, a second portion thereof may be alternatively coupled to interconnects for propagating clock or reset signals to the FPGA.

TABLE 1

FPGA I/O INTERFACE

|    | # |   | TEST MODE   |   | CONFIG MODES    |   | FUNCTIONAL MODE |
|----|---|---|-------------|---|-----------------|---|-----------------|
| d  | 1 | i | SWGATE = VREF | i | SWGATE = VREF | i | SWGATE = VREF   |
| d  | 1 | i | -OFF/ON     | 1 | -OFF/ON         | i | -OFF/ON         |
| d  | 1 | c | -CON        | c | -CON            | — | -CON = high Z   |
| d  | 1 | o | SO          | i | -CS = 0         | i | -CS = 1         |
| d  | 1 | i | SI          | c | CCLK            | — | CCLK = x        |
| d  | 1 | i | LSSDA       | i | M0              | — | M0 = x          |
| d  | 1 | i | LSSDB10     | i | M1              | — | M1 = x          |
| d  | 1 | i | LSSDC       | i | M2              | — | M2 = x          |
| d  | 1 | i | -MTEST = 0  | i | -MTEST = 1      | i | -MTEST = 1      |
| d  | 1 | i | -TESTMORE   | i | CLOCK1 = x      | i | CLOCK1          |
| m  | 1 | i | -RI         | * |                 | * |                 |
| m  | 1 | i | -DI1        | * |                 | * |                 |
| m  | 1 | i | -DI2        | * |                 | * |                 |
| m  | 1 | i | -C_TEST     | * |                 | * |                 |
| m  | 1 | i | -CONFG      | * |                 | * |                 |
| m  | 1 | i | -REPT       | * |                 | * |                 |
| m  | 8 | i | SITOP(0–7)  | * |                 | * |                 |
| m  | 8 | 0 | SOBOT(0–7)  | * |                 | * |                 |
| m  | 8 | i | SIRIGHT(0–7) | * |                | * |                 |
| m  | 8 | o | SOLEFT(0–7) | * |                 | * |                 |
| m  | 1 | i | SICONFIG    | * |                 | * |                 |
| m  | 1 | o | S0CONFIG    | * |                 | * |                 |
| m  | 1 | i | LSSDB1      | * |                 | * |                 |
| m  | 1 | i | LSSDB2      | * |                 | * |                 |
| m  | 1 | i | LSSDB3      | * |                 | * |                 |
| bs | 17 | * | IO         | c | ADDR(0–16)      | * | IO              |
| bs | 8 | * | IO          | c | DATA(0–7)       | * | IO              |
| bs | 1 | * | IO          | i | -CHECK(-RR/RW)  | * | IO              |
| bs | 1 | * | IO          | o | -CSOUT          | * | IO              |
| bs | 1 | * | IO          | o | -ERR            | * | IO              |
| bs | 1 | * | CLOCK2 OR IO | * | CLOCK2 OR IO   | * | CLOCK2 OR IO    |
| bs | 1 | * | CLOCK3 OR IO | * | CLOCK3 OR IO   | * | CLOCK3 OR IO    |
| bs | 1 | * | CLOCK4 OR IO | * | CLOCK4 OR IO   | * | CLOCK4 OR IO    |
| bs | 1 | * | CLOCK5 OR IO | * | CLOCK5 OR IO   | * | CLOCK5 OR IO    |
| bs | 1 | * | CLOCK6 OR IO | * | CLOCK6 OR IO   | * | CLOCK6 OR IO    |
| bs | 1 | * | -RESET OR IO | * | -RESET1 OR IO  | * | -RESET1 OR IO   |
| bs | 1 | * | -RESET OR IO | * | -RESET2 OR IO  | * | -RESET OR IO    |
| bs | 1 | * | -RESET3 OR IO | & | RESET OR IO   | * | RESET OR IO     |
| bs | ... | * | ...        | 8 | ...             | * | ...             |
| bs | 1 | * | IO          | * | IO              | * | IO              | i = input.
o = output.
c = common IO.
# = number of io (IO).
* = a functional IO.
d = dedicated IO, with test mode enabled by -MTEST = 0
& = -DI2 = 1. With configuration modes enabled by -CS = 0.
m = more test IO enabled by -MTEST = 0 & -TESTMORE = 0.
bs = latched boundary scan IO enabled by -RI = 1 & -DI1 = 1.

The two right most columns of Table 1, functional and configuration modes respectively, illustrate the allocation of various I/O ports of the FPGA to associated configuration and functional interconnects of the FPGA SWGATE provides a voltage reference to the FPGA. OFF/ON selects the FPGA its power up supply voltage. Control of the FPGA configuration and the state thereof is provided via CON, another dedicated I/O port "d". Additional configuration interconnects propagate signals such as: configuration select CS, configuration clock CCLK, check control CHECK for enabling a certain SRAM check operating mode, configuration select CSOUT for enabling configuration of another FPGA, and error ERR for reporting a configuration error of the FPGA. Further description of these configuration interconnects and associated signals is found in the above incorporated publication entitled "Application Note AT6000 Series Configuration."

When the test mode enable signal MTEST is properly activated, certain dedicated I/O ports are reallocated as test interconnects, as shown in Table 1. The port associated with configuration select CS is reallocated as a scan output SO. The port associated with configuration clock CCLK is reallocated as a scan input SI of the FPGA. Similarly, the ports associated with the confirmation mode selection M0–M2 are reallocated to LSSD clock interconnects LSSDA, LSSDB10 and LSSDC respectively. Finally, the port associated with clock interconnect CLOCK is reallocated to test more enable interconnect TESTMORE. Accordingly, some of the dedicated I/O ports "d" are dual use ports that are shared between different interconnects associated with configuring and testing of the FPGA.

When the FPGA is in its test mode, selected via MTEST, an expanded test interface can be provided by activating the more-test-enable signal TESTMORE. Thus, when MTEST and TESTMORE are both activated, an expanded test interface (as represented by the multi-use ports "m" of Table 1) is provided for enabling additional testing of the FPGA.

The interconnect associated with the receiver inhibit signal RI provides a direct control input for inhibiting certain receivers of the FPGA. DI1 and DI2 provide direct control of certain drivers associated with the FPGA. The interconnect associated with the MUX test control signal C_TEST provides a direct input for enabling testing of certain passgate multiplexers of the FPGA. Similarly, direct inputs CONFG and REPT enable operation of configuration scan chain 24 and repeater latch scan chains 30 respectively. The remaining test ports of the expanded interface are associated with scanning data into, or out of, the various repeater scan chains and configuration scan chains, and providing additional LSSD clocks for clocking the configuration scan chain.

When activated, the receiver inhibit signal RI prevents interconnects associated with functional inputs of the FPGA from receiving data thereof. Such functional inputs include the boundary scan I/O ports "bs", and the multi-use I/O ports "m" when allocated as functional ports (i.e. when TESTMORE is not activated). The first driver inhibit signal DI1, when activated, inhibits drivers of the functional output ports from sending out data of associated functional interconnects. These first sets of drivers include drivers of the boundary scan I/O ports "bs" and the multi-use I/O ports "m" that have been allocated to associated functional interconnects (i.e., when TESTMORE is not activated). On the other hand, the second driver inhibit signal DI2, when activated, inhibits the drivers of the dedicated I/O ports and the multi-use I/O ports "m" that have been allocated to the expanded test interconnects (i.e. when TESTMORE is activated). The last states of RI, DI1 and DI2 are retained when TESTMORE is not active.

Figure 2:
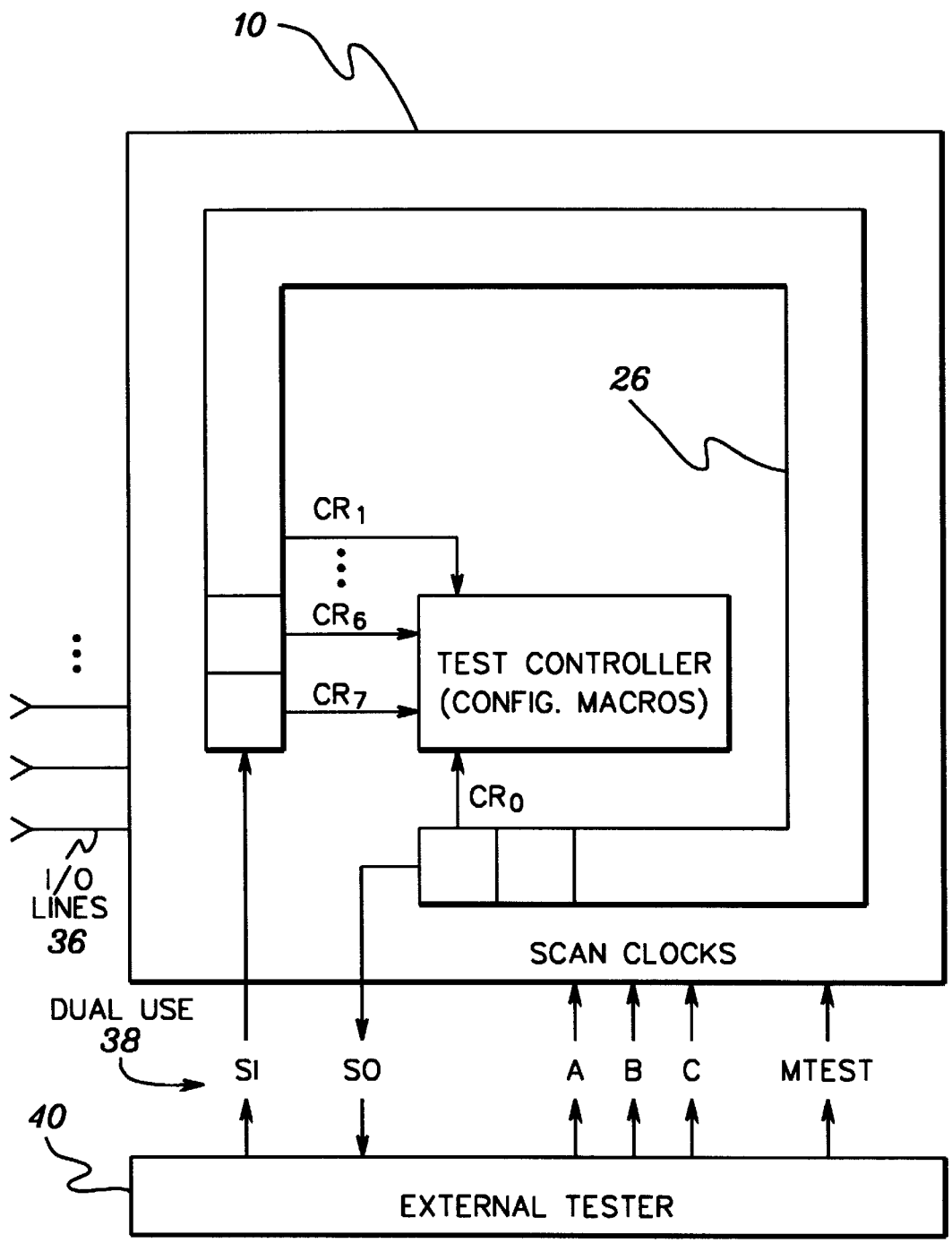
FIG. 2 is a block diagram illustrating an I/O boundary scan chain of a field programmable gate array.

I/O Boundary Scan Chain and Control Register:

With reference to FIGS. 1 and 2, I/O boundary scan chain 26 comprises a serial string of LSSD shift register latches which can be selectively intercoupled to the functional I/O interconnects 36 of FPGA 10. An external test controller 40 activates test enable signal MTEST for enabling access to, and operation of, the I/O boundary scan chain 26. External tester 40 interfaces the I/O boundary scan chain via the scan in SI and scan out SO interconnects and provides the LSSDA, LSSDB10 and LSSDC clocking signals to associated interconnects as necessary for operating the I/O boundary scan chain 26.

Figure 3:
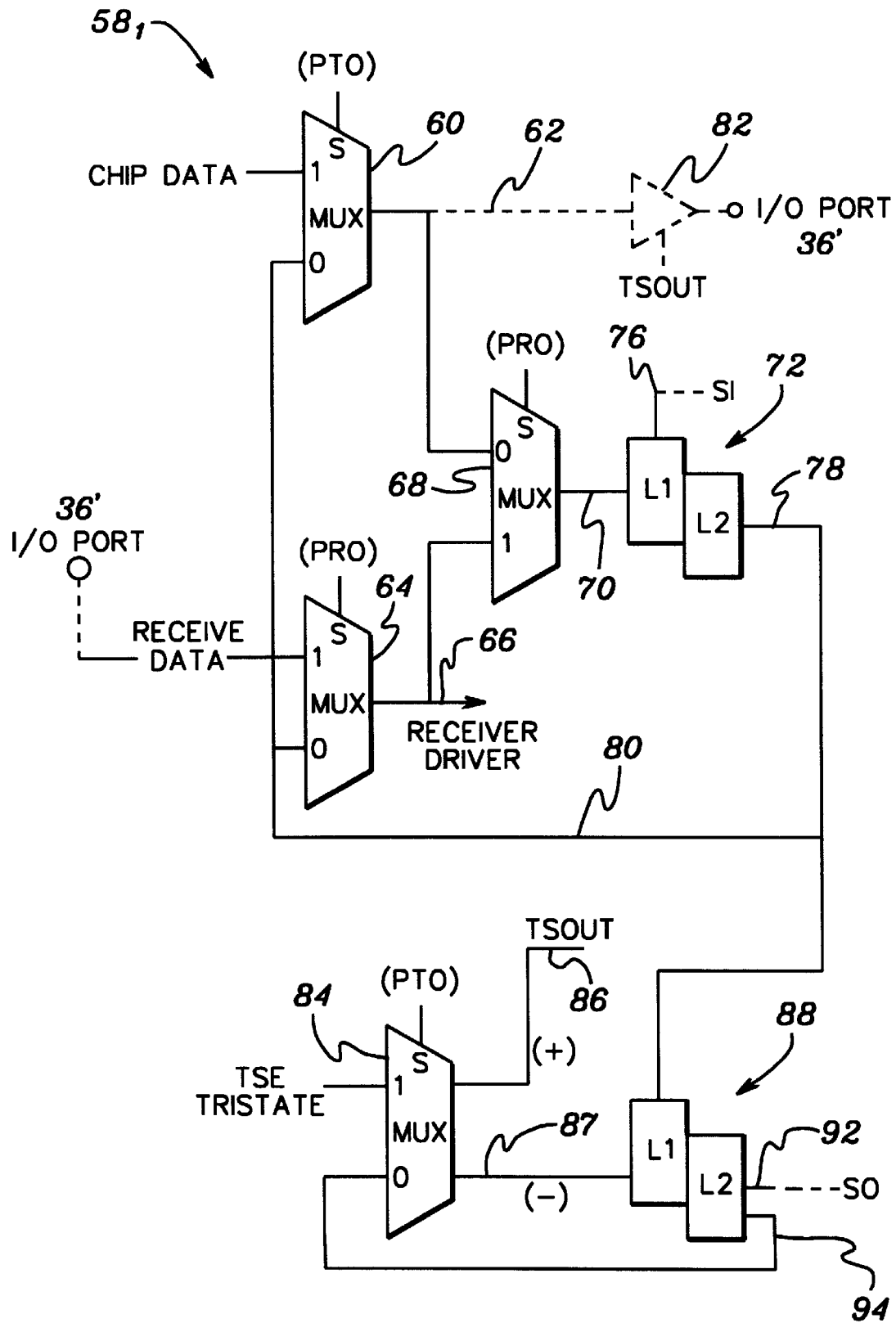
FIG. 3 is a block diagram of an I/O boundary scan cell of the I/O boundary scan chain of FIG. 2.

With reference to FIG. 3, each cell 56 of I/O boundary scan chain 26 includes two LSSD shift register latches 72,88. Master latch L1 of the first LSSD shift register 72 has scan input 76 for receiving serial data of the associated scan chain, and primary input 70 (negative logic) coupled for receiving data from the output of multiplexer 68. The serial output 78 from slave latch L2 of the first LSSD shift register 72 is coupled to the serial input (positive logic) of the master latch L1 of second LSSD shift register 88. A primary input of the master latch L1 of the second shift register is coupled to receive data from the output from multiplexer 84. The slave latch L2 of the second LSSD shift register 88 has scan output 92 for shifting out serial data.

Four multiplexers 60,64,68,84 provide selective coupling of the LSSD shift registers to respective interconnects of the FPGA. The multiplexer states are controlled by control signals PTO and PRO, and either or both polarities of the signals can be routed therefrom based on circuit requirements. Control signal PTO controls the configuration of multiplexers 60 and 84, while control signal PRO controls the configuration of multiplexers 64 and 68. When control signal PTO is activated, multiplexer 60 is enabled for coupling an interconnect from internal the FPGA to the multiplexer's output 62. Likewise, multiplexer 84 is enabled for coupling the tri-state enable signal from an interconnect internal the FPGA to its (positive) output 86 for selectively enabling tri-state buffer 82 and its (negative) output 87 to latch 88. When tri-state buffer 82 is enabled, the data presented at output 62 of multiplexer 60 is propagated toward the associated I/O port 36'. In the alternative state for control signal PTO, multiplexer 60 outputs data as stored in the first LSSD register latch 72 via line 80, and multiplexer 84 selectively enables tri-state buffer 82 in accordance with data stored in the second LSSD register latch 88 via line 94. Accordingly, control signal PTO controls data transmission from internal the FPGA to associated I/O ports 36'.

Figure 4:
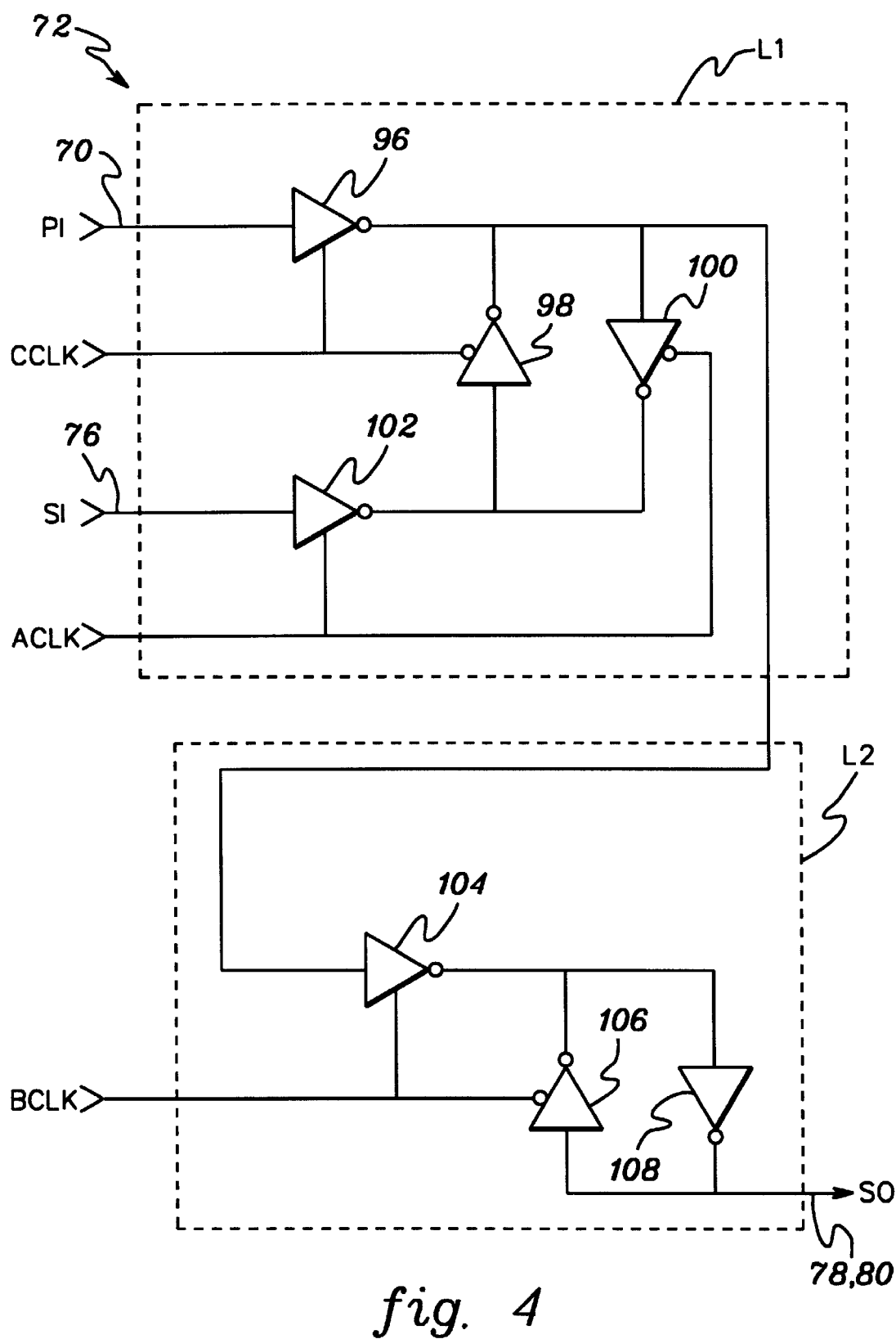
FIG. 4 is a schematic diagram illustrating first and second shift register latches of the I/O boundary scan cell of FIG. 3.

Control signal PRO controls multiplexers 64 and 68 for determining what data will be received by the associated LSSD register latch 72. Multiplexer 64 selectively couples the associated I/O port 36' or the output 80 of the first LSSD register latch 72 to the multiplexer's output 66 for propagating data to an associated internal interconnect of the FPGA. Multiplexer 68 determines whether to couple the primary input 70 of the first LSSD register latch 72 to receive data from multiplexer 60 or alternatively from multiplexer 64. In this fashion, the transmit and receive control signals, PTO and PRO respectively, control whether the associated LSSD shift register latch is to receive data from internal the FPGA (via MUXs 60 and 68), or from an associated I/O port 36' (via MUXs 64 and 68). Note, FIG. 3 does not show the A, B and C LSSD clocks as required for providing known LSSD shift register operations. Coupling of these respective LSSD clocks are presumed for these shift register latches of FIG. 3 as shown in the schematic diagram of FIG. 4.

In a preferred embodiment of the present invention, each of the LSSD shift register latches 72,88 of an associated cell of the I/O boundary scan chain 26 includes a master latch L1 and a slave latch L2. Master latch L1, with reference to FIG.

4, comprises tri-state inverters 98 and 100. The latched tri-state inverters 98,100 receive serial input data from serial input 76, via tri-state inverter 102 when enabled per its associated LSSD-A clock. Alternatively, the master latch L1 receives input data from primary input 70 via tri-state inverter 96 when enabled per an associated LSSD-C clock.

Slave latch L2 comprises latched tri-state inverter 106 and inverter 108. Data of master latch L1 is coupled to slave latch L2 via tri-state inverter 104 when enabled per its associated LSSD-B clock. Data of the slave latch is provided at serial output 78, 80. It will be understood that alternative LSSD shift register latches and signal routing schemes may be employed within the I/O boundary scan chain 26 so long as they provide similar LSSD functionality.

With reference to FIGS. 1, 2 and 5a, I/O boundary scan chain 26 includes a portion thereof that is associated with providing data to control register 28 of test circuitry 22. In the default I/O boundary scan chain configuration of FIG. 5a, eight registers of the I/O boundary scan chain 26 are in series with an I/O ring portion 58 thereof. The last bit 48 of the I/O boundary scan chain 26 is associated with providing C_TEST control data for register $CRL_0$ of control register 28. The next portion 58 of the I/O boundary scan chain 26 provides I/O ring boundary scan access to functional interconnects 36 and associated I/O ports. Finally, the remaining portion 42,44,46 of the I/O boundary scan chain 26 is associated with providing seven additional bits of control data to be loaded into the remaining seven registers $CRL_1$, $CRL_2$ ... $CRL_7$ of control register 28 shown in detail in FIG. 5b.

In a reduced I/O boundary scan chain configuration, with reference to FIG. 5b, the boundary scan chain 26 omits I/O ring portion 58. Accordingly, the eight data bits associated with loading control register 28 may be loaded serially into the reduced boundary scan chain 26 with 8 clock cycles, without having to clock data through the multiple LSSD registers of the I/O ring 58.

In a further reduced I/O boundary scan configuration, as shown in FIG. 5c, boundary scan chain 26 comprises a single bypass register 42 wherein serial data bypasses the remaining portions of the I/O boundary scan chain 26. When two FPGA's are combined together with associated I/O boundary scan chains coupled in series, this single bypass register configuration may be selected for the first up-stream FPGA so that serial data can be loaded into the second down stream FPGA without having to pass through the entire I/O boundary scan chain of the first FPGA.

TABLE 2

CONTROL SIGNALS OF A FPGA CONTROL REGISTER

| CONTROL REGISTER | |
| --- | --- |
| -BP | One bit scan chain bypass control. |
| -CNTL | Control Register and Boundary Scan steering. |
| -PR0, -PT0 | Boundary Scan latch application and steering. |
| -RI | FPGA Receiver inhibit control. |
| -DI1 | FPGA Functional Driver inhibit control. |
| -DI2 | FPGA Dedicated Driver inhibit control. |
| -C_TEST | FPGA Chip mux testability control. |

Control register 28 of test circuitry 22 provides a variety of control signals. With reference to FIG. 5b and Table 2, control register 28 includes register $CRL_7$ for providing bypass control signal BP for enabling the reduced boundary scan chain configuration comprising the single bit bypass register 42 as shown in FIG. 5c. Another register $CRL_6$ provides control signal CNTL for selectively channeling data of the I/O boundary scan chain through, or bypassing, the LSSD registers associated with I/O ring 58. Two other registers $CRL_5, CRL_4$ of control register 28 provide the receiver and transmit control signals PRO, PTO respectively for controlling configurations of the multiplexers in cells of the I/O boundary scan chain 26 as described hereinbefore with reference to FIG. 3. Three other registers $CRL_1, CRL_2$, $CRL_3$ provide associated driver and receiver inhibit control signals DI2,DI1,RI1 respectively for inhibiting the respective driver and receiver functionalities of various I/O ports, as described hereinbefore with respect to Table 1. A final register $CRL_0$ of control register 28 provides control signal C_TEST, which selectively activates certain pulldown devices in passgate multiplexers of the FPGA during testing thereof.

Figure 6A:
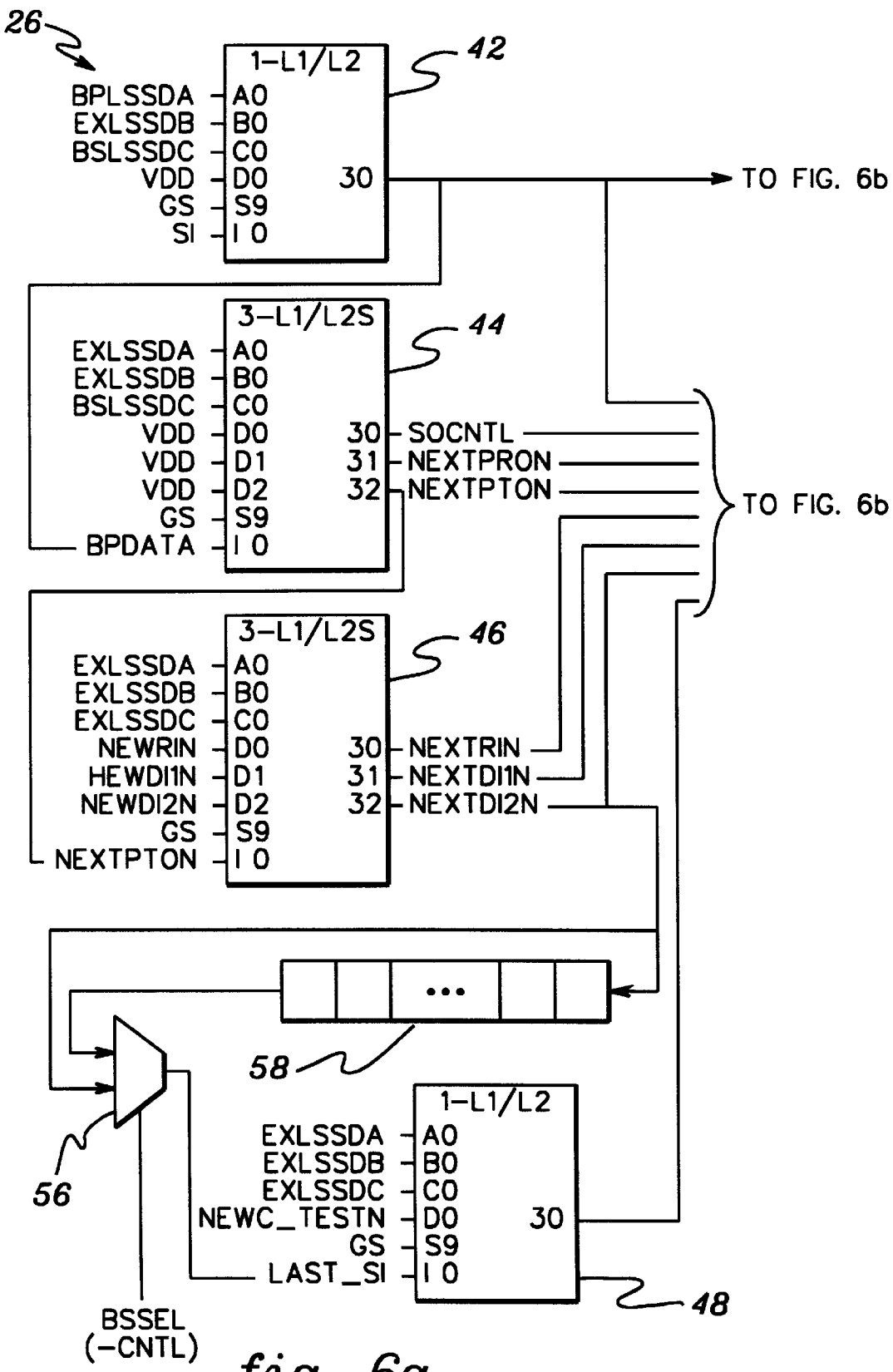
FIGS. 6a and b are a block diagram representative of the control register and its associated portion of the I/O boundary scan chain.
Figure 6B:
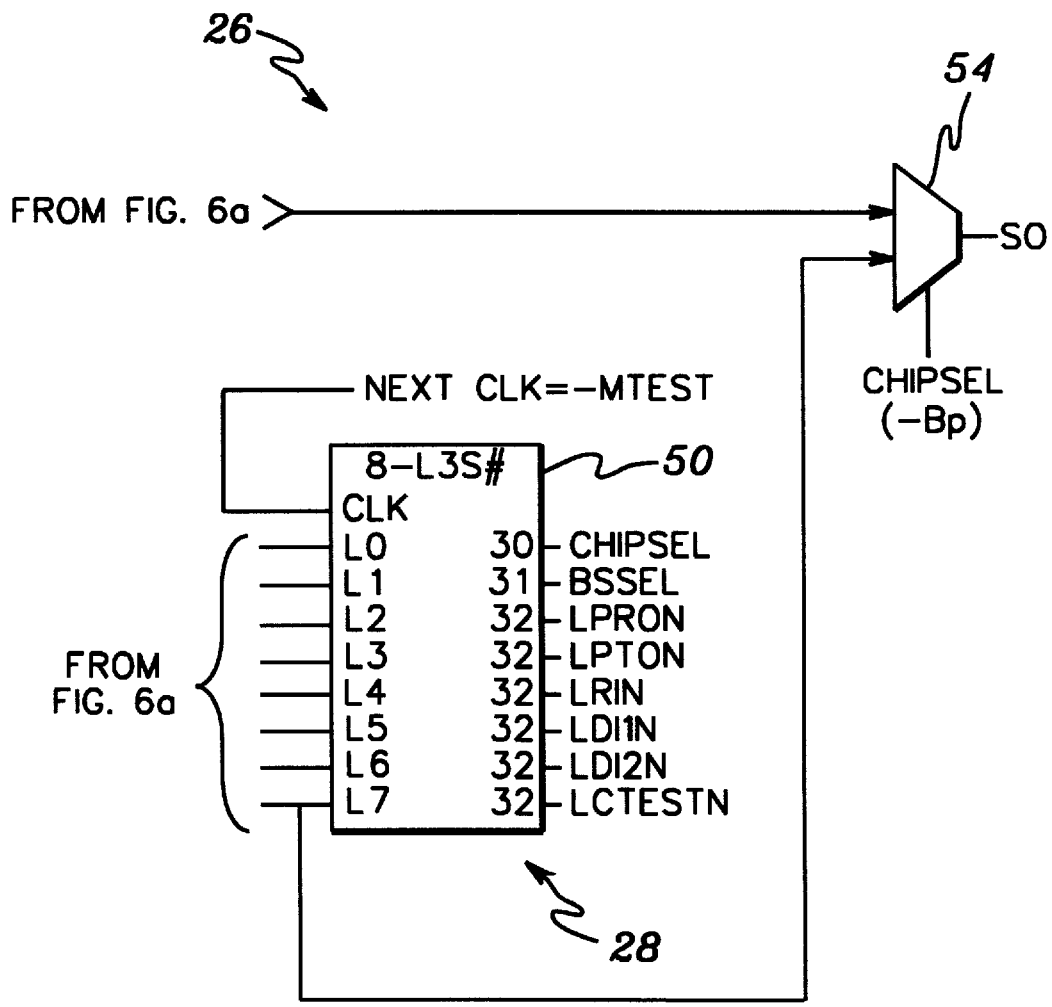

FIGS. 6a–b show control register 28 as a third level of latching coupled with associated portions of the I/O boundary scan chain 26 for receiving data therefrom. Once appropriate data has been loaded into appropriate registers 42,44, 46,48 of I/O boundary scan chain 26, MTEST is activated for clocking data into control register 28. Note that data can be passed through the I/O boundary scan chain 26 without affecting the contents of control register 28; control register 28 is updated when MTEST transitions high, or when MTEST and TESTMORE are both active, low.

Multiplexer 56 determines the serial input for the last shift register latch 48 of the I/O boundary scan chain 26. Multiplexer 56 couples this serial input to either the serial output of I/O ring portion 58, or the serial output of portion 46 of the I/O boundary scan chain 26, in accordance with the state of the boundary scan control signal CNTL. Multiplexer 54 selects the serial output SO for the FPGA. For the single bit bypass register configuration, multiplexer 54 selectively couples the serial output SO of the FPGA to the serial output of the first register latch 42 of I/O boundary scan chain 26, in accordance with the state of the bypass control signal BP. Alternatively, multiplexer 54 couples the serial output SO of the FPGA to the serial output of the last register 48 of I/O boundary scan chain 26 for providing the serial output data.

Initially at power on, the control register is initialized to all ones "1," which places the FPGA in its normal functional mode with MTEST=1. When loading the control register with new values, all control data is scanned into the I/O boundary scan chain 26 via associated LSSDA and LSSDB clock pairs. Data for C_TEST is the first bit scanned in while data for the bypass control signal BP is the last bit scanned in.

Figure 7A:
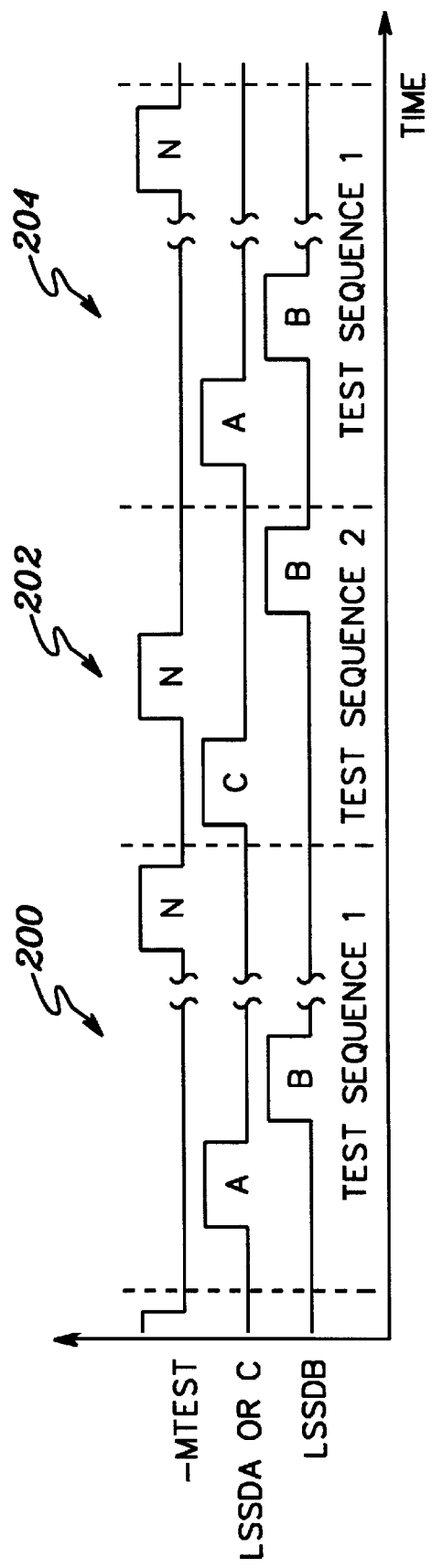
FIG. 7a is a timing diagram representative of signals associated with operating the I/O boundary scan chain in association with the control register.

FIG. 7a provides a timing diagram associated with operating the I/O boundary scan chain, wherein the portion thereof associated with the control register 28 is in series with I/O ring portion 58. During this operating sequence, it is assumed that the expanded test interface control signal TESTMORE, the bypass control signal BP, and the boundary scan steering control signal CNTL are all inactive. Accordingly, multiplexer 56 (FIG. 6) selects the serial output of I/O ring portion 58 as the serial input to the last register 48, and multiplexer 54 selects data from the serial output of the last register 48 of the I/O boundary scan chain as the serial output SO of the FPGA. The timing diagram consists of three intervals 200, 202 and 204. During interval 200, data is serially loaded into the I/O boundary scan chain by a sequence of LSSDA and LSSDB clock pairs. After serially loading the I/O boundary scan chain, a subsequent pulse "N" of MTEST updates control register 28 in accordance with the data of the associated cells of the I/O boundary scan chain 26.

During interval 202, an LSSDC clock pulse provides a snap shot for capturing data into I/O boundary scan chain 26 as presented at associated primary inputs. Portions of the I/O boundary scan chain associated with control register 28, as shown in FIG. 6, are updated in accordance with data presented at their respective primary inputs. For example, cell 42 associated with the bypass control signal BP has its primary input coupled to VDD and accordingly will be updated to "1" per the LSSDC clock pulse. Similarly, the three cells of the next portion 44 have their respective primary inputs coupled to VDD for updating the boundary scan steering control signal CNTL and the multiplexer control signals PRO, PTO to "1's" in preparation of an impendent boundary scan chain sequence. The remaining cells of portions 46,48 associated with loading the control register 26 with data for providing control signals RI, DI1, DI2, and C_TEST, have respective primary inputs fed back coupled to respective shift register outputs so as to retain their current values. Subsequent the LSSDC clock pulse, another pulse "N" of MTEST forwards the L1 latch values of portions 42,44,46,48 through respective L2 latches and into control register 28 accordingly. During the MTEST pulse "N", the L1 latch values are flushed through associated L2 latches for only those cells of the I/O boundary scan chain associated with the control register. Other cells of the I/O boundary scan chain require a subsequent LSSDB clock pulse in order to transfer data from associated L1 latches to respective L2 latches, in preparation for the impendent boundary scan.

During interval 204, a sequence of LSSDA and LSSDB clock pairs are provided for scanning data out of the I/O boundary scan chain, while simultaneously scanning in new data. Thereafter, pulse "N" of MTEST again updates the control register with new values.

In an alternative reduced configuration for the I/O boundary scan chain, a different sequence of signals are employed for loading the control register and testing the FPGA, as shown in FIG. 7b. During interval 206, MTEST is held low for enabling test operation of the I/O boundary scan chain. The LSSDA and LSSDB clock signals are both held high while applying a "1" to the serial input of the I/O boundary scan chain, so as to flush "1" values through the I/O boundary scan chain. During interval 208, the LSSDA clock is held high and the LSSDB clock is held low while a "0" is applied to the serial input. Accordingly, a "0" value is loaded into the first L1 latch of the I/O boundary scan chain. Next, the LSSDA clock returns low and a "B1" pulse of the LSSDB clock shifts the "0" value of the first L1 latch into the first L2 latch. A second pair of LSSDA and LSSDB clock pulses transfer the "0" value of the first cell of the I/O boundary scan chain into the second cell thereof while scanning in a new "1" value into the first cell. After the second "B2" pulse, of the LSSDB clock, the first and second cells of the I/O boundary scan chain are loaded with 1 and 0 respectively.

During interval 210, an "N1" pulse of MTEST updates the control register in accordance with the data of the associated cells of the I/O boundary scan chain. The bit bypass BP and the boundary scan steering control CNTL portions of the control register are updated with 1 and 0 respectively. With boundary scan steering control signal CNTL held low, multiplexer 56 (with reference to FIG. 6) applies the serial output of portion 46 of the I/O boundary scan chain to the serial input of portion 48, bypassing I/O ring portion 58. During a subsequent boundary scan, new data is scanned into the cells of the I/O boundary scan chain associated with loading the control register for updating the control register accordingly.

In some applications, as mentioned hereinbefore, two or more field programmable gate arrays are used, wherein the I/O boundary scan chain associated with a first upstream field programmable gate array is connected serially with the I/O boundary scan chain of a second downstream FPGA. During testing, for example, it may be desirable to load the I/O boundary scan chain of a second FPGA while bypassing the I/O boundary scan chain of a first FPGA. Accordingly, the first FPGA has single bit bypass control signal BP updated for selecting the alternative reduced I/O boundary scan chain configuration comprising the single bit bypass register alone. FIG. 7c shows the sequence of signals associated with providing this bypass configuration. During interval 212, the cells of the I/O boundary scan chain are flushed with "1's". During interval 214, an LSSDA and LSSDB clock pulse pair load the first cell of the I/O boundary scan chain of the first FPGA with a "0" value. A pulse "N1" of MTEST updates the control register of the first FPGA, setting the bypass control signal BP to "0".

During interval 216, the subsequent boundary scan operation BS1 passes data through the single bit bypass cell of the first FPGA and into the I/O boundary scan chain associated with the second down-stream FPGA. During the same boundary scan operation BS1, new data can be loaded into the one bypass register of the first FPGA as associated with the bypass control signal, wherein a subsequent N2 pulse of MTEST can accordingly alter the state of the bypass control signal BP. In the example above, first and second FPGA's were described with respective boundary scan chains serially connected. It will be noted that the same principals are applicable to more than two such FPGAs.

The next section describes various test configurations of the FPGA, and associated values for the signals of the control register.

TABLE 3

FPGA CONTROL REGISTER STATE TABLE
(Default values after Power-on or configuration MOD0 are 'BS or SN.')

| STATE | -BP | CNTRL | -PR0,-PT0 | -RI,-DI1,-DI2 | -C_TEST |
|---|---|---|---|---|---|
| BS or SN | 1 | 1 | (1,1) | (1,1,1) | 1 |
| CARD | 1 | 1 | (1,0) | (1,1,1) | x |
| CHIP | 1 | 1 | (0,1) | (x,0,1) | 0 |
| ISLT | 1 | 1 | (x,x) | (0,0,0) | 1 |
| REG-ONLY | 1 | 0 | (1,1) | (1,1,1) | 1 |
| BYPASS | 0 | x | (1,1) | (1,1,1) | 1 |

Test Configurations Effected by the Control Register:

When all of the control signals of the control register (i.e. BP, CNTL, PR0, PT0, RI, DI1, DI2 and CTEST) are 1's, as shown in Table 3, the control register is in its normal or default state for enabling boundary scan BS or snap shot SN operation. In boundary scan operation, LSSDA and LSSDB clock pairs propagate data through the I/O boundary scan chain. In snap shot operation, an LSSDC clock pulse captures data into the I/O boundary scan chain as received at associated primary inputs. The receiver and driver inhibit control signals RI, DI1, DI2 are all high such that none of the receivers or drivers associated with the I/O ports are inhibited. The multiplexer control signals PT0, PR0 (for controlling multiplexers of the cells associated with I/O boundary scan chain as presented hereinbefore with reference to FIG. 3) are high, keeping the respective shift register latches of the I/O boundary scan chain out of associated I/O data paths.

When transmit control signal PT0 is set low, the I/O boundary scan chain is configured for parametric card test, CARD. Multiplexer 60, with reference to FIG. 3, selects the data of slave latch L2 of the first LSSD register 72 as the data to be output toward I/O port 36 via tri-state buffer 82.

Multiplexer 84 enables tri-state buffer 82 in accordance with the data contents of slave latch L2 of the second LSSD register 88. The receiver control signal PR0 remains high; accordingly, a LSSDC clock pulse captures CARD data into master latch L1 of the first LSSD register 72 as received from I/O port 36' via multiplexers 64 and 68. Master latch L2 of the second LSSD register 88 captures a tri-state control signal as presented thereto by its associated slave latch L2, as was scanned in during a preceding boundary scan operation.

During CHIP test, referring again to Table 3, the receiver control signal PR0 and the first driver inhibit control signal DI1 are both held low, such that data from within the chip is inhibited from driving its associated functional I/O port. With receiver control signal PR0 held low, multiplexer 64 (FIG.3) forwards data into the FPGA (chip) as provided by the slave latch L2 of the first LSSD register 72. With PT0 held high, a LSSDC clock pulse will capture data into the master latch L1 of the first LSSD register 72 as received from within the FPGA (chip) via multiplexers 60 and 68. Master latch L1 of the second LSSD register 88 captures tri-state control data as provided from within the chip via multiplexer 84.

In chip isolation testing ISLT, all receivers and drivers of the I/O ports are inhibited by holding the associated receiver and driver inhibit control signals RI,DI1,DI2, active low. Under this condition, each of the I/O ports are set for an isolated, high impedance condition. Accordingly, faults in the ports may be determined by detecting sink or source currents associated therewith.

The two remaining states of Table 3 include a register only state REG-ONLY, and a bypass state BYPASS. The register only state, REG-ONLY, is provided when the boundary scan steering control signal CNTL is set low, as described hereinbefore, wherein the I/O boundary scan chain is set for its reduced configuration comprising only the portion thereof associated with loading the control register. In the bypass state, BYPASS, as explained hereinbefore, the I/O boundary scan chain is in its further reduced configuration comprising only the single bit bypass register alone.

Figure 8:
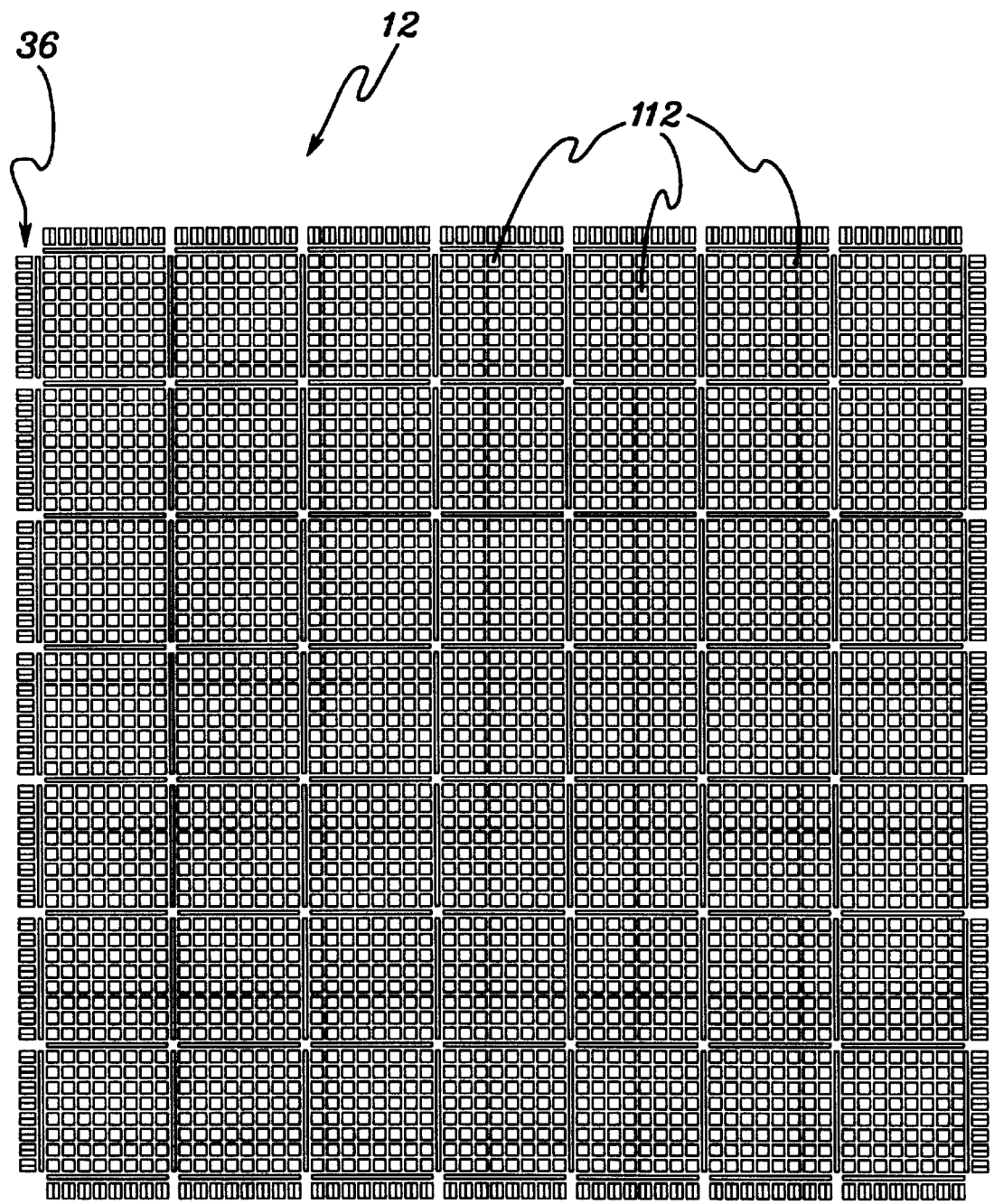
FIG. 8 illustrates a plurality of programmable logic cells of a programmable gate array.

Additional Features of the FPGA Associated With Testing:

With reference to FIG. 8, the programmable resources 12 of FPGA 10 include a plurality of programmable logic cells arranged in a 56×56 array. The array of logic cells are divided into sectors 112 with each sector comprising an 8×8 grouping of logic cells. Again, further description of such logic cells is provided in the above incorporated portions of the U.S. patent application entitled "Programmable Logic Cell."

Figure 9:
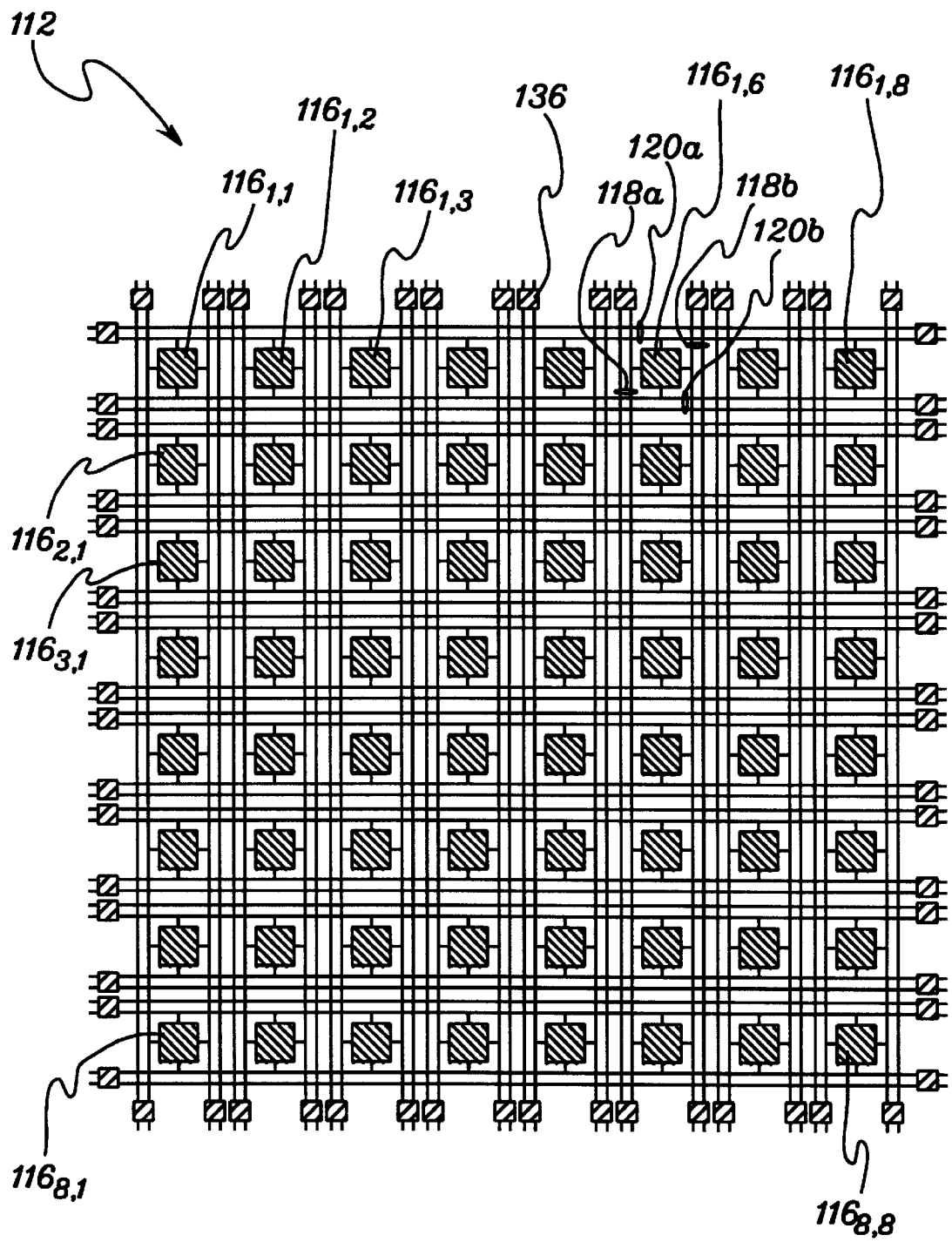
FIG. 9 is a diagram of a sector portion of the programmable gate array of FIG. 8, illustrating an array of programmable logic cells and an associated interconnect network for selectively connecting the programmable logic cells.

FIG. 9 shows a single sector 112 of programmable logic cells $116_{1,1}$ through $116_{8,8}$. Logic cell $116_{1,6}$, for example, is surrounded by vertical interconnect conductors 118a and 118b and horizontal interconnect conductors 120a and 120b. Similar horizontal and vertical interconnect conductors are positioned between the various rows and columns of the array for providing connections between any two logic cells in the array and associated I/O ports. The interconnect conductors together form the overall programmable interconnect network of the programmable array, which network can be implemented according to the above incorporated portions of the U.S. Patent Application entitled "Programmable Array Interconnect Network." Repeater or switch circuits 136 can be employed in the network, as discussed further below.

Programmable multiplexers (not shown) of each of the logic cells 116 provide selective coupling between the respective logic cells and associated signal lines of the buses surrounding the logic cells. These multiplexers are implemented as passgate multiplexers and include an additional pulldown (or alternatively pull-up) passgate device (not shown) which is selectively enabled in accordance with the multiplexer test control signal C_TEST, provided by control register 28, for assisting testing and fault isolation of the various multiplexers within the field programmable gate array. Further description of such pulldown (or pull-up) multiplexer features and associated test procedures is provided in the reference of M. Belkadi et al., entitled "Modeling and Test Generation for MOS Transmission Gate Stuck-Open Faults," IEE PROCEEDINGS-G, Vol. 139, No. 1, pp. 17–22, (February 1992), which is hereby incorporated herein by reference.

Figure 10:
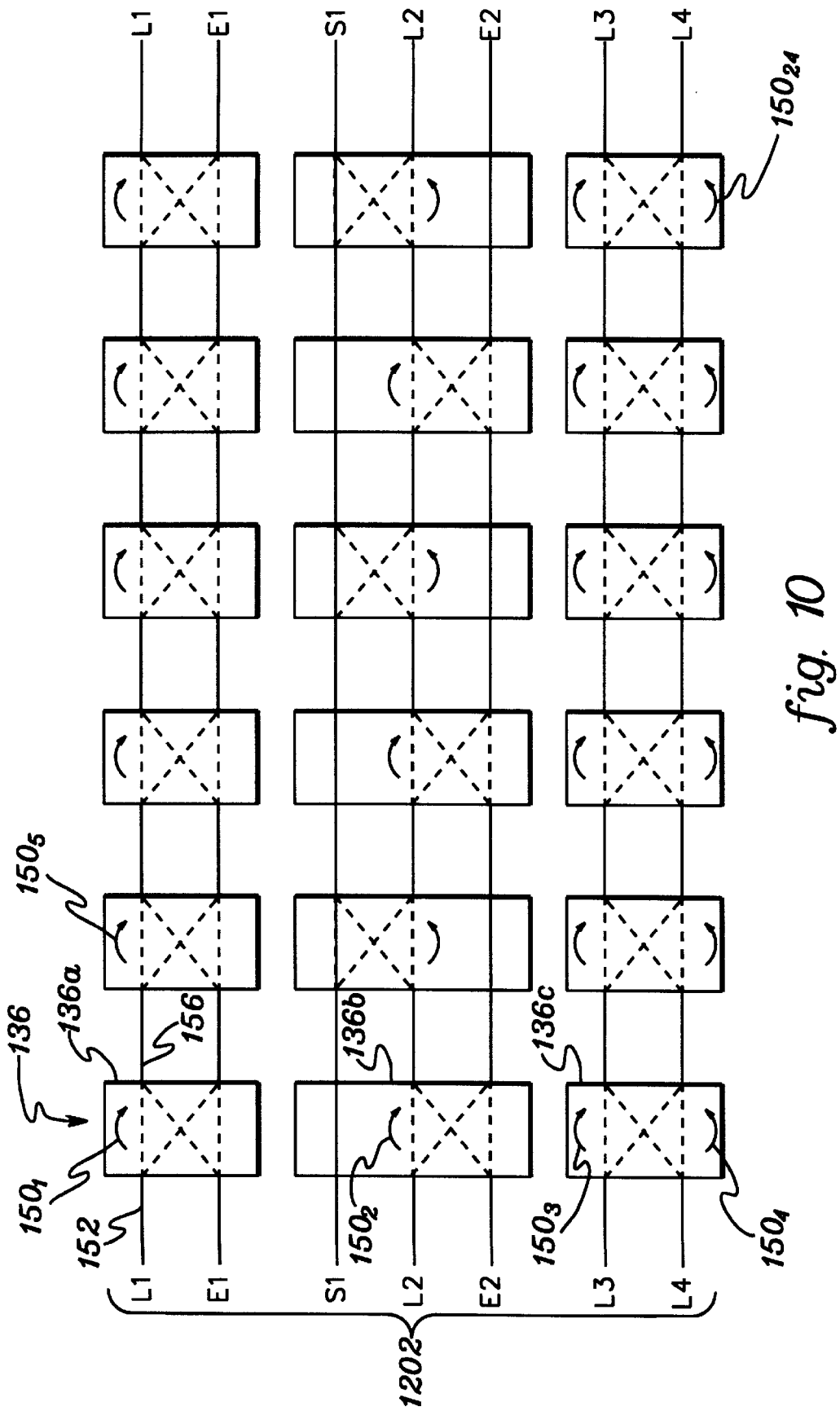
FIG. 10 is a block diagram illustrating repeater circuits of a programmable bus associated with a row of logic cells of the programmable gate array.

Buses 120a, as associated with one side of a row of core cells within the programmable gate array, are shown in FIG. 10. A repeater or switch circuit, such as repeater 136a, is associated with local bus L1 and express bus E1 at an interval of every 8 core cells, i.e. at each sector boundary. Repeater latches 150 (represented by arrows) are provided in parallel with each repeater circuit in associated local buses. Repeater latch $150_1$, for example, comprises a LSSD register coupled between portion 152 and portion 156 of local bus L1. Similar repeater latches $150_2$, $150_3$, $150_4$ are shown associated with local buses L2, L3, and L4 respectively, within repeater circuits 136b and 136c.

Repeater Scan Chains:

With reference to FIGS. 10 and 1, the plurality of repeater latches $150_1$, $150_2$, ... $150_{24}$, are configured together as a serial scan chain, for example, repeater scan chain $30_1$. The repeater, or interconnect, scan chain enables scanning of data serially into, and out of, the respective repeater latches. Each of the sequential repeater latches has its serial output connected to the serial input of the subsequent repeater latch within the associated serial scan chain. The serial input of the first repeater latch ($150_1$) of the scan chain ($30_1$) provides the scan input for the associated repeater scan chain, while the serial output of the last repeater latch ($50_{24}$) of the scan chain ($30_1$) provides the scan output for the associated repeater scan chain. The serial inputs and serial outputs of the repeater scan chains 30 are identified in accordance with associated column and row scan chains. The serial inputs to seven columns of repeater scan chains are provided by interconnects SITOP(0–7). The associated serial outputs for the column repeater scan chains are provided by interconnects SOBOT(0–7). The serial inputs and outputs for the row repeater scan chains are similarly provided by interconnects SIRIGHT(0–7) and SOLEFT(0–7) respectively. Each of the repeater latches within the repeater scan chains share LSSDA, LSSDB, and LSSDC clocks for enabling synchronous and parallel LSSD scan operations of the respective repeater scan chains. LSSD clocking of the respective repeater scan chains is provided via associated I/O interconnects LSSDA, LSSDB10, and LSSDC when MTEST is active, low. Operation of the repeater scan chains is enabled via the repeater scan chain control REPT. Access to these interconnects of the repeater scan chains is provided at associated multi-use I/O ports "m" when MTEST and TEST-MORE control signals are both active, low.

Each repeater latch is individually programmable, per its associated configuration data, for enabling a primary output thereof to be selectively coupled to its portion of the associated local bus. The configuration data for each repeater latch is stored within associated memory cells of configuration SRAM memory 14. Further description of the repeater scan chains is provided in the above incorporated portions of the U.S. Patent Application entitled "Programmable Array Interconnect Latch."

Configuration Scan Chain:

As described hereinbefore, with reference to FIG. 1, configuration logic 16 and decoder/sequencer 18 enable loading of configuration data into SRAM 14 for configuring the programmable resources of FPGA 10. The above incorporated references, "Application Note AT6000 Series Configuration," and U.S. Pat. No. 5,298,805 entitled "Versatile and Efficient Cell-to-Local Bus Interface in a Configurable Logic Array," disclose known operating modes of the configuration logic for accessing the associated SRAM memory 14. The decoder/sequencer 18 provides efficient allocation of memory 14 to the various programmable resources 12 of the FPGA as described in the above incorporated portions of the U.S. Patent Application entitled "Continuous Address Structure With Folding." LSSD register latches are arranged as a serial scan chain bounding and segmenting various regions of the configuration logic. This configuration scan chain 24 enables serial scan access and functional verification of the configuration logic.

Figure 17:
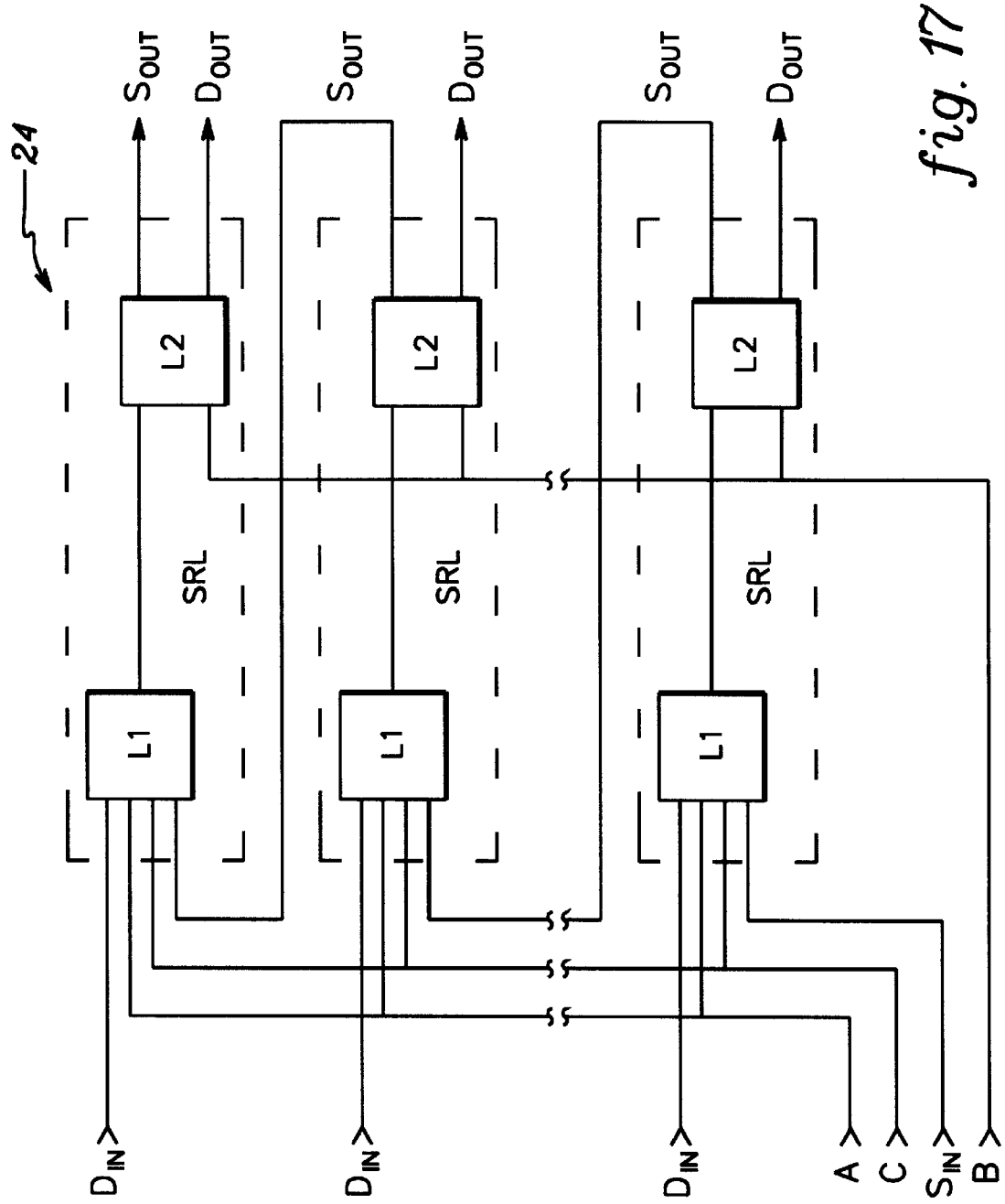
FIG. 17 depicts additional detail of an exemplary shift register latch of the configuration logic scan chain of FIG. 1.

The LSSD shift registers of the configuration scan chain 24 are implemented and operated in accordance with principles identified in the references: "A Logic Design Structure For LSI Testability," by E. B. Eichelberger et al., 14th Design Automation Conference Proceedings, Jun. 20, 21 and 22, 1977, New Orleans, La., IEEE Cat.No.77, CH 1216-1C, pp. 462–468; "Boundary-Scan Design Principles For Efficient LSSD ASIC Testing," by R. W. Bassett et al., IBM Journal of Research and Development, Vol. 34, No. 2/3, March/May 1990, pp. 339–354; and U.S. Pat. No. 3,783,254, entitled "Level Sensitive Logic System," issued to Eichelberger. FIG. 17 depicts exemplary shift register latches arranged as serial scan chain 24, and of the type disclosed in these documents.

With reference to Table 1, access to the configuration scan chain 24 is provided via configuration scan input SICONFIG and configuration scan output SOCONFIG. These scan ports permit LSSD access to and from the configuration scan chain. Operation of the configuration scan chain is selectively enabled per its associated configuration control signal CONFG. Clock signals associated with operating the configuration scan chain include LSSDA, LSSDC and LSSDB10, LSSDB1, LSSDB2 and LSSDB3. These associated clock interconnects are made available at the dedicated "d" and multiple-use "m" I/O ports when MTEST and TESTMORE are both active.

Typically, operation of a known FPGA involves loading SRAM 14 with configuration data via associated configuration logic for configuring the FPGA for implementing a desired, user-defined circuit. If the resulting circuit did not function correctly, it was not clear where in the FPGA the problem arose. Proper circuit configuration and operation is dependent upon each of the FPGA subsystems. The configuration logic must be operating properly to assure proper loading of configuration data into SRAM 14. SRAM 14 must be capable of storing configuration data and driving the programmable resources of the FPGA per the associated configuration data. Finally, the programmable resources and interconnects must be programmable and operable for implementing its desired functionality within the user defined circuit. Thus, the various subsystems of the FPGA are highly interdependent. In accordance with the present invention, a sequence of tests is implemented in an appropriate divide and conquer fashion for systematically determining proper functionality of each subsystem of the FPGA, taking into account the inter dependencies of the various subsystems within the FPGA.

The next portion of this description describes the test methods for testing an FPGA via the various subsystems as characterized hereinbefore.

Figure 11:
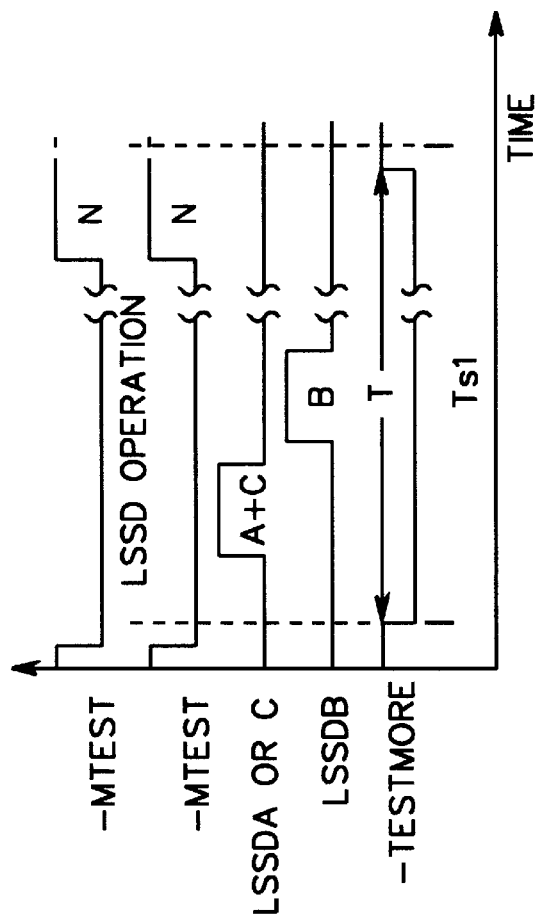
FIG. 11 is an abbreviated timing diagram showing clocking and associated control signals employed during testing of a programmable gate array when accessing all pins thereof.

Test Methods:

When performing a test of the FPGA, an external tester may access all pins of the FPGA, or a reduced set thereof. FIG. 11 shows a timing diagram wherein an external tester accesses all pins of the FPGA. When MTEST is low, the FPGA is in its test mode, wherein LSSDA, LSSDC and LSSDB clock sequences provide LSSD operation of respective scan chains within the FPGA. While TESTMORE is low during interval T, data of that portion of the I/O boundary scan chain associated with the multi-use I/O ports (with reference to Table 1) is not applied to the associated I/O interconnects. However, data of the remaining portion of the I/O boundary scan chain, as associated with the functional I/O ports "bs", is applied to the respective I/O interconnects in accordance with the states of the receive and transmit multiplexer control signals PR0 and PT0 respectively. In addition, when TESTMORE is low, direct inputs are available for receiving receiver and driver inhibit control signals RI, DI1, DI2 respectively, and the chip multiplexer test control signal C_TEST. After interval T, MTEST returns high, wherein the latches of the control register 28 associated with the direct input control signals provide values for these control signals as were applied directly during interval T.

Figure 12:
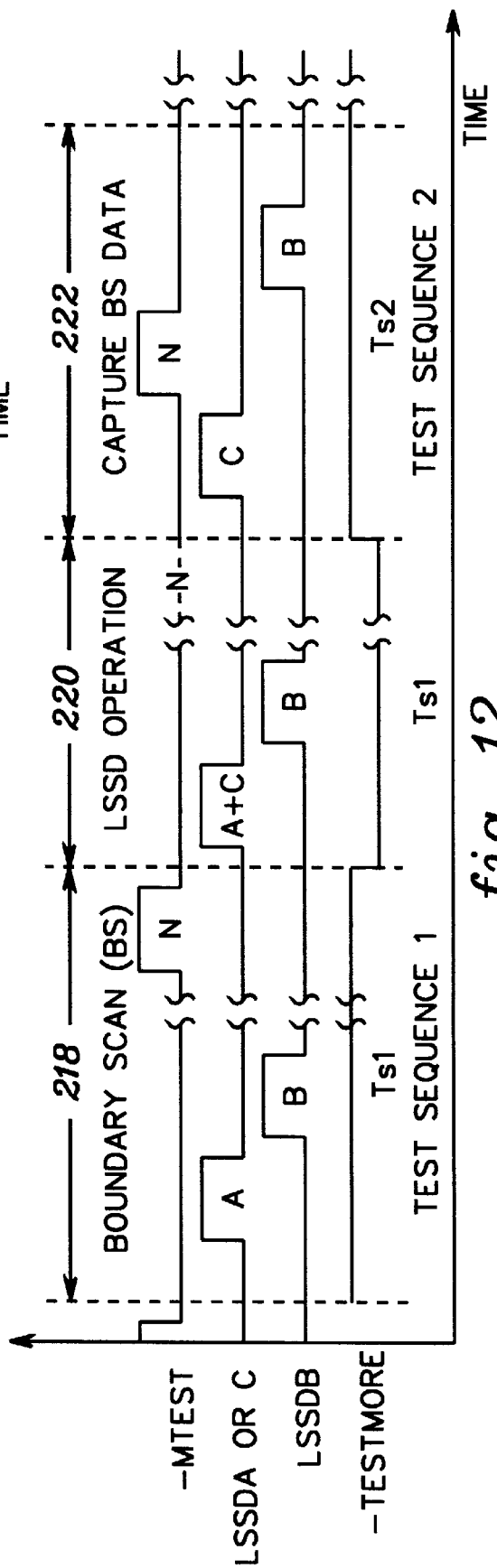
FIG. 12 is a timing diagram showing clocking and control signals associated with testing a programmable gate array when accessing a reduced number of I/O pins.

In alternative test operations of the FPGA, an external tester accesses only the dedicated "d" and multi-use "m" I/O ports of the FPGA during testing. With reference to FIG. 12, the external tester provides LSSD operation of the I/O boundary scan chain during interval 218 for loading desired values therein for PR0, PT0, RI, DI1, DI2 and C_TEST. These values are then latched into control register 28 by pulse "N" of MTEST, establishing a desired test state for the FPGA (i.e. scan, chip, card or isolation testing) as described hereinbefore with reference to Table 3.

During interval 220, TESTMORE is held low for providing the external tester an expanded test interface, i.e. multiple-use ports "m", enabling additional testing of the FPGA. The external tester executes certain LSSD test operations for testing the FPGA during interval 220 (as will be described hereinafter), while providing required values directly for the receiver and driver inhibit control signals. The values that are provided for the receiver and driver inhibit control signals when TESTMORE is low, will remain in effect once TESTMORE returns high, unless changed thereafter by a subsequent boundary scan update or configuration of the FPGA. Interval 222 corresponds to interval 202 as described hereinbefore with reference to FIG. 7a.

Whether all, or a reduced set, of pins of the FPGA are accessed during testing by the external tester, a couple of different LSSD test operations can be provided during the intervals T of FIGS. 11 and 12. With reference to FIG. 13, when TESTMORE is active low, REPT can be asserted for enabling operation of the various repeater scan chains 30. During interval 224, the LSSDA and LSSDB clock sequences scan data into the repeater scan chains via respective scan inputs, i.e. SITOP(0–7) and SIRIGHT(0–7). The contents of each of the LSSD registers of the repeater scan chains are then applied to their corresponding local bus segments in accordance with respective repeater latch configuration data as stored in SRAM 14.

During interval 226, an LSSDC clock pulse captures data of various bus segments, as presented to the primary inputs of respective shift registers into the repeater scan chains. A subsequent LSSDB clock pulse shifts the captured data from the master latches of the LSSD registers into respective slave latches in preparation for an impendent scan out. During interval 228, a sequence of LSSDA and LSSDB clock pulses scan data out of the various repeater scan chains, via associated scan outputs SOBOT(0–7) and SOLEFT(0–7).

Such repeater scan chain operations are employed for testing bus configurations of the programmable interconnect network. Known data is scanned into the various repeater scan chains and applied to associated segments of the bus interconnects. The bus interconnects are previously configured for propagating data between primary outputs to primary inputs of respective LSSD shift register latches of the same or different repeater scan chains. Data is then captured by the receiving LSSD shift register latches, recovered, and compared to the applied data for determining whether or not respective segments of the bus interconnects are functioning appropriately for propagating data.

In an alternative application, the repeater scan chains are employed during testing of a given programmed logic circuit of the FPGA. In such applications, additional system clock operations (not shown) may be provided between intervals 224 and 226 of FIG. 13. The known data is scanned into a given repeater scan chain and applied to the given programmed logic circuit. The optional system clock operations may then be provided for processing the known data therein. After appropriate processing by the given program logic circuit, a subsequent LSSDC clock pulse captures data as provided by the given programmed logic circuit into a receiving repeater scan chain. This captured result data is then scanned out, recovered and analyzed for determining proper functionality of the given programmed logic circuit.

Another LSSD procedure which can be performed during interval T of the timing diagrams of FIGS. 11 and 12, includes operation of the configuration scan chain 24 (FIG. 1) for testing configuration logic 16,18. During interval 230 of the timing diagram of FIG. 14, the configuration control signal CONFG is held low for enabling operation of the configuration scan chain. A sequence of LSSDA and LSSDB clock pulses is provided for scanning data into the configuration scan chain per its serial input, SICONFIG. In this fashion, the state machine of the configuration logic is set to a predetermined state with a known test vector applied thereto for simulating a transition condition. Ideally, the state machine should then transfer from the predetermined state to a subsequent state in accordance with the known test vector. During interval 232, an LSSDC clock pulse is followed by a sequence of subsequent LSSD B clock pulses of varying time offsets in order to appropriately capture data of the associated state machine. The plurality of B clocks are associated with various domains of the configuration logic, are time offset to provide compatibility with the timing requirements of the configuration logic. Accordingly, the LSSD design of the configuration scan chain meets the requirements of the LSSD methodologies disclosed in the above incorporated references entitled "A Logic Design Structure For LSI Testability," "Boundary-Scan Design Principles For Efficient LSSD ASIC Testing," and U.S. Pat. No. 3,783,254. During interval 234, the sequence of LSSDA and LSSDB clock pulses scan data out of the configuration logic scan chain for recovering the result data of the configuration logic. The result data is then examined for determining whether or not the configuration logic sequenced properly to the appropriate state in accordance with the applied test vector.

An additional test method utilized by the present invention comprises a known operating mode of the configuration logic, mode-7, for enabling testing of SRAM 14. With reference to Table 1, MTEST is held high, and the configuration select signal CS is held low for placing the FPGA in the configuration mode. With the FPGA in the configuration mode, the configuration logic is placed in a mode-7 condition, via the three mode select inputs M0, M1 and M2. Upon selecting mode-7, an external tester is allowed read/write access to SRAM 14 via associated address and data ports, ADDR(0–16) and DATA(0–7) respectively. To test SRAM 14, known data is first stored into given locations of the SRAM. Data is subsequently read from these given locations and compared with the known data previously loaded therein for determining whether or not the SRAM is operating properly. Mode-7 and its associated operation is described more fully in the above incorporated portions of the reference entitled "Application Note AT6000 Series Configuration", and U.S. Pat. No. 5,298,805 issued to Gaverick et al. entitled "Versatile and Efficient Cell-to-Local Bus Interface in a Configurable Logic Array".

Having identified various test methods employed within the present invention, the next section of this disclosure describes test sequences employing the above test methods, for testing a programmable gate array.

Test Sequences:

As mentioned hereinbefore, the various subsystems of an FPGA are highly interdependent upon one another. The present invention provides a sequence of test methods for testing the various subsystems of the FPGA, taking into account the interrelated dependencies of these subsystems, and enables isolation of faults therein. At power on, internal SRAM 14 of a FPGA in accordance with the present invention, with reference to FIG. 1, is initialized with all locations thereof set to known pre-existing states. An external tester enables the FPGA for testing by holding MTEST low. The external tester then tests the serial scan functionality of I/O boundary scan chain 26, by propagating data through the scan chain via associated interconnects scan in SI, scan out SO, and appropriate LSSD clocking per clock interconnects LSSDA, LSSDB10, and LSSDC respectively. The serial data scanned into the I/O boundary scan chain is subsequently scanned out and recovered. The recovered data is then compared with that scanned in for determining proper scan functionality of the I/O boundary scan chain.

Next, the I/O ports of the FPGA are tested per their default configurations. The I/O ports are programmable in accordance with configuration data as stored in associated locations of SRAM 14. At power on, SRAM 14 is initiated to a known reset condition. Accordingly, the I/O ports of the FPGA are in their default configurations. As described hereinbefore, the multiplexers associated with the cells of the I/O boundary scan chain 26 are controlled by the transmit and receiver control signals, PT0 and PR0 respectively, as provided by control register 28. At power on, each of these control signals are set to a known default condition. Likewise, the receiver and driver inhibit control signals (RI, DI1, and DI2) also provided by control register 26, provide default power-on values as necessary for testing the default configurations of the I/O ports. The multiple-use I/O ports "m" are kept in their functional settings by holding the expanded test interface control signal TESTMORE high. Accordingly, the I/O boundary scan chain is employed for testing the functionality of the functional I/O ports, including the boundary scan "bs" and multiple-use ports "m" as listed in Table 1, per their default configurations.

Having determined functionality of the I/O boundary scan chain, and the functional I/O ports of the FPGA per their default configurations, the test sequence of the present invention preferably moves on to testing configuration logic 16,18 via associated configuration scan chain 24. The test enable control signal MTEST is held low and the expanded test interface control signal TESTMORE is also held low for enabling the expanded test interface, multiple-use I/O ports "m". Accordingly, access is provided to the configuration scan chain via the configuration scan input SICONFIG, the configuration scan output SOCONFIG, and associated LSSD clock lines LSSDA, LSSDB10, LSSDC, LSSDB1, LSSDB2 and LSSDB3. LSSD operation of the configuration scan chain is enabled by holding the configuration enable CONFG low. As described hereinbefore with reference to FIG. 14, predetermined test vectors are scanned into the configuration scan chain and applied to the configuration logic for testing the state sequences of the associated state machine. Result data, as provided by the configuration logic, is captured via the configuration scan chain and compared against expected result data for determining proper functionality of the configuration logic.

Upon determining functionality of the configuration logic, the next step comprises testing SRAM 14, verifying the ability to load and store configuration data therein for configuring the various programmable resources of the FPGA. To initiate this test, the test enable control signal MTEST is held high and the configuration select CS held low for selecting the configuration operating mode of the FPGA. Appropriate data is then applied to the mode select inputs M0, M1 and M2 for enabling mode-7 operation as described hereinbefore. During mode-7 testing of the SRAM, a variety of predetermined test vectors are written into and read from the various locations of the SRAM for verifying the ability of the SRAM to receive and retain configuration data therein. At this point, the configuration logic and memory subsystems of the FPGA have been functionally tested, verifying the ability to load configuration data into the SRAM for configuring functional subsystems of the FPGA.

In an earlier test, the I/O ports were tested in accordance with their default configurations, before having determined functionality of the configuration logic and the SRAM. This next step returns to the I/O ports, and provides further testing of the I/O ports per their various programmable configurations. SRAM 14 is loaded with configuration data as required for programming the I/O ports in a particular programmable configuration to be tested. During such testing, the receiver and driver inhibit control signals RI, DI1, and DI2, and multiplexer receive and transmit control signals PR0 and PT0, are set for enabling the desired boundary scan parametric test of the I/O ports.

Examples of programmable I/O port configurations include the I/O port configured with a pull-up device to an upper supply voltage, with a pulldown device to ground, or for a given output impedance. The I/O boundary scan chain is employed for sending appropriate data to the I/O ports for testing these programmed configurations, or alternatively for latching and recovering data therefrom as configured. When latching data per an LSSDC clock pulse, the I/O boundary scan chain captures internal data of the FPGA, or data of the I/O ports, in accordance with the state of the transmit and receive control signals PT0 and PR0, and the state of the receiver and driver inhibit control signals RI, DI1, and DI2 as provided by the control register.

The next step in the test sequence examines serial scan functionality of the repeater scan chains 30. The test enable signal MTEST and the expanded test interface enable signal TESTMORE are held low for enabling the expanded test interface associated with the multiple-use I/O ports "m". The repeater enable REPT is held low for enabling operation of the respective repeater scan chains. Serial data is scanned into the repeater scan chains, via respective serial inputs SITOP(0–7) and SIRIGHT(0–7). Appropriate LSSDA and LSSDB clock pulses are provided for shifting the serial data through the respective repeater scan chains. The data scanned out is recovered and compared to that scanned in for determining scan shift functionality of the repeater scan chains. With the serial data paths of the repeater scan chains verified, the repeater scan chains are then employed during testing of the programmable interconnects of the FPGA.

In testing the programmable interconnects, configuration data is first loaded into the SRAM 14 (FIG.1) for configuring given programmable interconnects between I/O ports of the FPGA, cells of the I/O boundary scan chain 26 and shift register latches of the repeater scan chains 30. More specifically, the programmable interconnects are configured: between functional I/O ports and shift register latches of the repeater scan chains; between I/O boundary scan cells and shift register latches of the repeater register scan chains; and/or between shift register latches of first transmit repeater scan chains and subsequent shift register latches of second receiving repeater scan chains. Thereafter, test data is applied to input sides of the respective configured interconnects via the associated I/O ports, I/O boundary scan cells and/or first transmit repeater scan chains. The test data is applied per appropriate configuration of associated I/O ports, I/O boundary scan cells and/or transmit repeater scan chains. Thereafter, result data at the output sides of the respective configured interconnects is latched into the shift register latches of associated receiving repeater scan chains. This latched data is then scanned out, recovered and compared with the test data that was applied to the input sides of the interconnects for determining appropriate functionality of the configured interconnects. This sequence of configuring interconnects, applying test vectors and recovering and comparing result data is continued a plurality of times in order to determine proper functionality of the various configurations of the programmable interconnects of the FPGA.

In an alternative procedure, test data is passed through the configured interconnects in an opposite direction; i.e. between transmit repeater scan chains and associated receiving I/O ports, I/O boundary scan cells and first repeater scan chains. Preferably, a plurality of configured interconnects are tested in parallel by operating associated repeater scan chain strings synchronously and in parallel.

Figure 15:
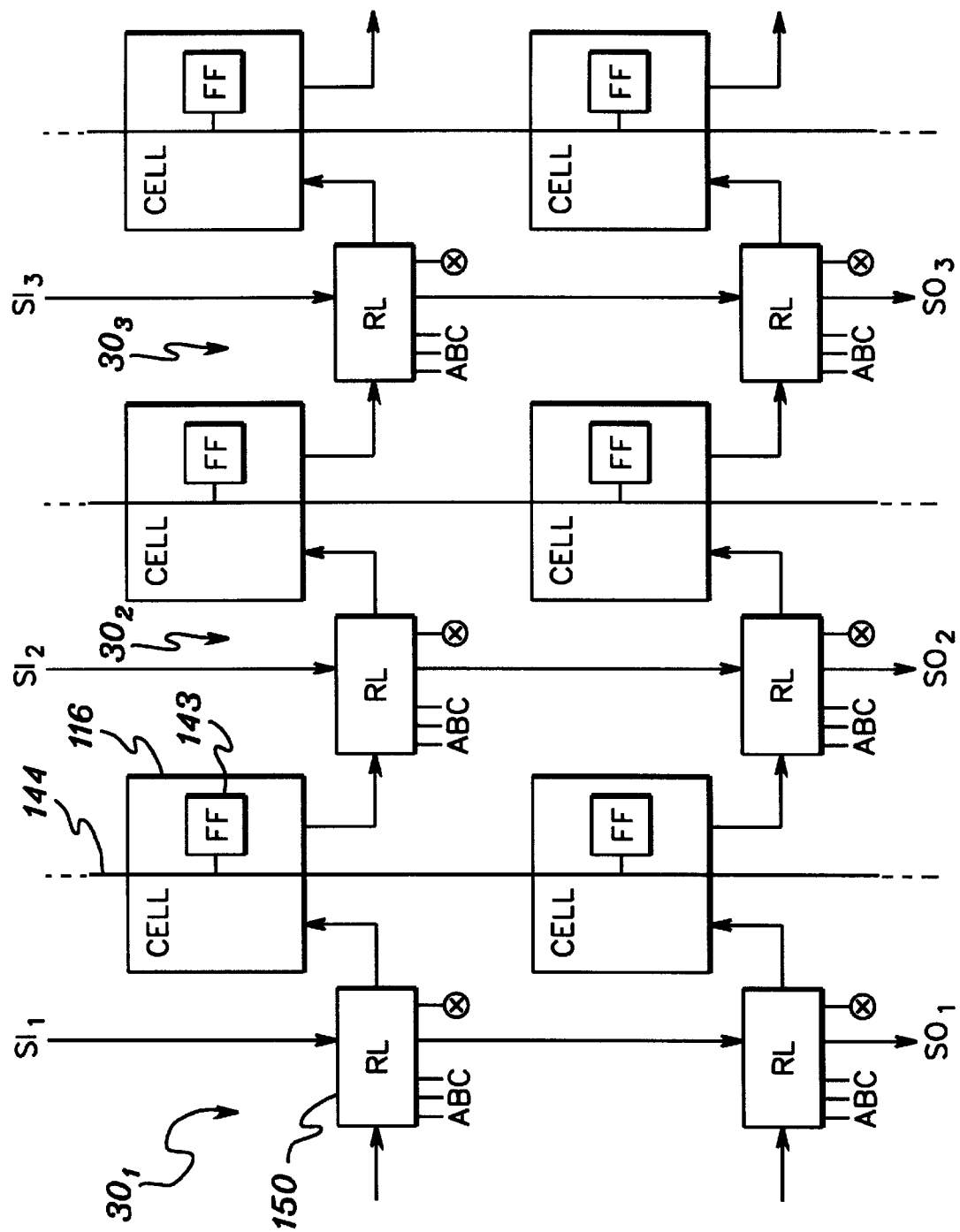
FIG. 15 is a partial schematic diagram illustrating repeater scan chains configured for testing core cells of a programmable gate array.
Figure 16:
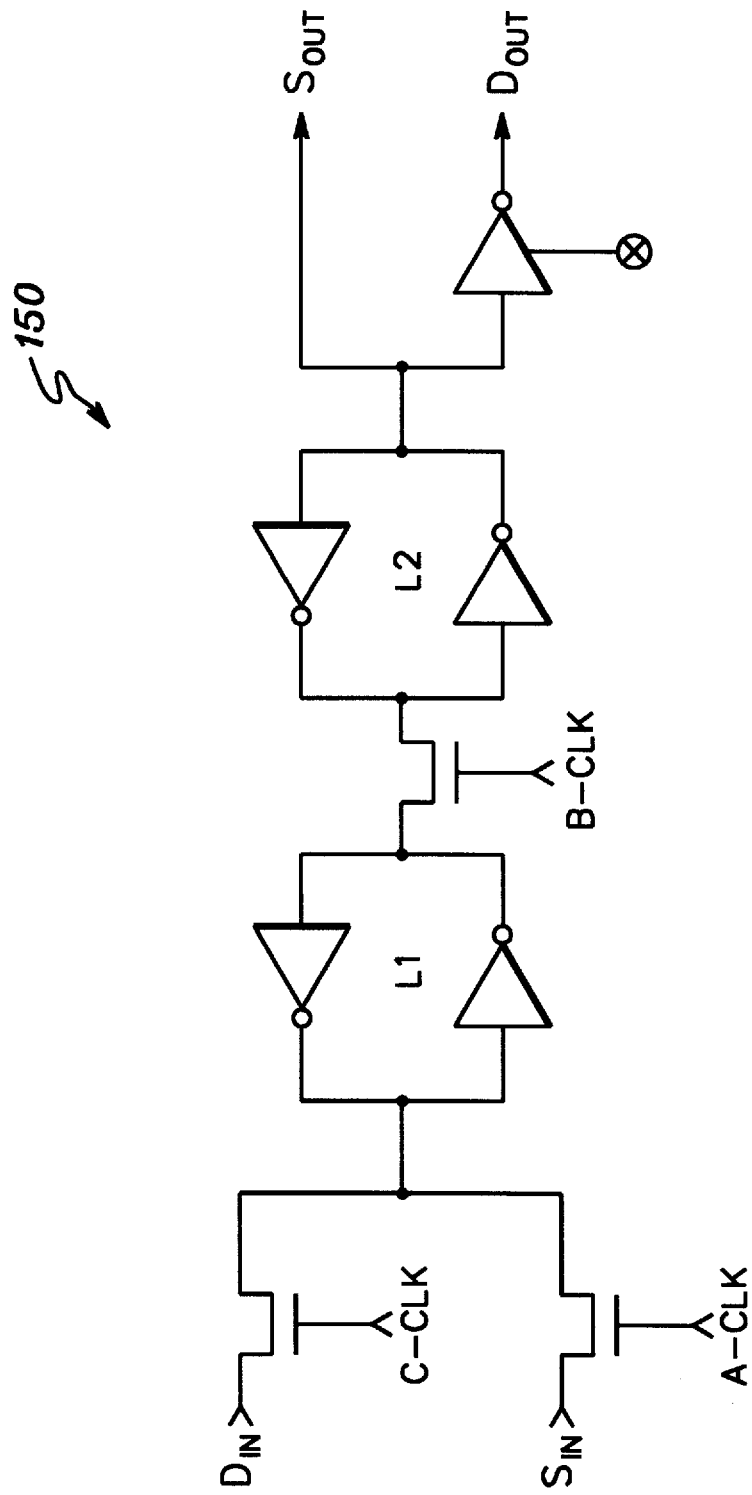
FIG. 16 depicts additional detail for one of the shift register latches of FIG. 15.

Logic cells 116 of FPGA 10 are then tested using steps similar to those used for testing the interconnects. SRAM 14 is loaded with configuration data for programming logic cells into desired logic configurations. Programmable interconnects of the FPGA are likewise configured for interfacing the logic cells between input and output repeater scan chains. In alternative configurations, similarly as described with reference to testing the programmable interconnects, either the input or the output repeater scan chain is substituted by I/O ports or the I/O boundary scan chain for applying/receiving data to/from the associated logic cells 116. With reference to FIG. 15, logic cells 116 are shown coupled between shift register latches 150 of associated repeater scan chains 30. (FIG. 16 depicts additional detail of one shift register latch 150, including master latch L1 and slave latch L2 as disclosed in the above-incorporated U.S. Patent Application entitled "Programmable Array Interconnect Latch.").

Upon appropriately configuring logic cells 116 and associated interconnects, predetermined test vectors are scanned serially into the associated repeater scan chains 30. The shift register latches of the repeater scan chains are configured per respective configuration data for applying data thereof to associated programmed logic cells 116, via respective interconnects. After appropriate processing by the programmed logic cells 116, an LSSDC clock pulse is applied to the repeater scan chains for latching result data, as effected by the logic cells 116, into receiving shift register latches of associated repeater scan chains. Upon latching the result data, the result data is scanned out of the repeater scan chains and compared to predetermined expected values for determining proper functionality of the logic cells 116 as programmed for the desired logic configuration. In the alternative configurations, the result data may be read directly from associated I/O ports of the FPGA, or via associated cells of the I/O boundary scan chain. Preferably, multiple logic cells are tested in parallel via respective plurality of synchronously operated, parallel repeater scan chains.

Upon programming and testing one configuration of logic cells 116, the test procedure is performed repeatedly for alternate configurations of the logic cells until having tested the various configurations thereof. In this fashion, each of the programmable elements of the logic cell are tested including, for example, programmable interconnect (passgate) multiplexers, programmable logic gates, and programmable pulldowns and pull-ups. When testing passgate multiplexers of logic cells 116, an additional chip multiplexer test control signal C_TEST is set low for configuring internal pulldowns of the multiplexers, so as to enable detection of faults therein in accordance with the above incorporated portions of the reference entitled "Modeling and Test Generation MOS Transmission Gate Stuck-Open Faults."

In testing synchronous logic elements of logic cells 116, for example, D-flip/flops 143 with reference to FIG. 15, the logic cells 116 are configured for passing data through the flip/flops. The logic cells are further configured to receive system clock signals from clock lines 144. Similarly as described hereinbefore with reference to testing the logic cells, known test data is scanned into input repeater scan chains 30, which are configured for applying the known data to the configured logic cells 116. A system clock signal is then provided for latching data into flip/flops 143 of the various logic cells 116. Result data as provided by the flip/flops 143 is then captured in associated shift register latches of receiving repeater scan chains via an LSSDC clock pulse. The latched data is then scanned out, recovered and compared to the applied test data for determining proper functionality of the flip/flops 143. Note, that the above procedure for testing the functionality of the flip/flops, also verifies operation of the clock lines 144.

Some field programmable gate arrays include a plurality of programmable clock distribution lines by which flip/flops 143 may alternatively receive clock signals. For these FPGAs, the above flip/flop testing procedure is repeated a plurality of times, with the clock distribution network configured differently for each such test procedure in order to test each of the clock distribution configurations of the FPGA.

Similar procedures are used for testing reset functionality of the flip/flops and associated reset distribution resources of the FPGA. In performing such tests, the flip/flops of the core cells are first initialized to a known set condition whereupon a reset pulse is propagated thereto over a given configured reset network. The resulting data contents of the flip/flops is then latched into shift register latches of appropriately configured receiving repeater scan chains. Next, the resulting data is scanned out of the repeater scan chains, recovered and analyzed for determining proper reset functionality.

In a further aspect of the present invention, FPGA 10 is programmed for implementing a desired user defined logic circuit, which may employ a plurality of logic cells 116. Cells of the I/O boundary scan chain, and/or shift register latches of the repeater scan chains, are configured for providing LSSD access to the user defined logic circuit, enabling application of data to, and receipt of data from, the configured logic circuit. A predetermined test vector is scanned into the appropriately configured input scan chains and then applied to the configured logic circuit. After the configured logic circuit has been allowed to process the applied test vector, which may include application of associated system clock operations, an LSSDC latching clock pulse is provided for latching result data, as effected by the logic circuit, into the shift register latches of the appropriately configured receiving scan chain(s). This result data is then scanned out, recovered, and compared to predetermined expected result data for determining proper functionality of the user defined logic circuit.

Accordingly, a variety of test methods have been disclosed for enabling testing of the various subsystems of an FPGA. In addition, comprehensive test sequences have been disclosed for testing the various subsystems of the FPGA in a manner taking into account interdependencies between the various subsystems of the FPGA.

While the invention has been particularly shown and described with reference to preferred embodiments thereof, it will be understood by those skilled in the art that various other changes in form and details may be made therein without departing from the spirit and scope of the invention.

What is claimed is:

1. An improved testable field programmable gate array, FPGA, having:
   a plurality of I/O ports;
   I/O functional signal lines coupled to associated I/O ports of said plurality of I/O ports;
   a plurality of programmable operating units providing particular logic circuits in accordance with associated logic configuration data;
   a plurality of programmable interconnects interconnecting the I/O functional signal lines and programmable logic units of the plurality of programmable operating units in accordance with associated routing configuration data;
   a plurality of memory cells associated with the respective plurality of programmable logic units and plurality of programmable interconnects, designated memory cells of the plurality of memory cells retaining the associated logic configuration data and routing configuration data; and
   configuration logic having inputs receiving memory request signals, the configuration logic providing access to memory cells of the plurality of memory cells in accordance with the memory request signals;
   wherein the improvement of the testable field programmable gate array includes test circuitry comprising:
      first LSSD scan registers disposed as a boundary scan chain across the I/O functional signal lines, said first LSSD scan registers providing selective coupling into associated I/O functional signal lines for enabling serial scan access to, and functional verification of, the I/O functional signal lines and associated I/O ports;
      second LSSD scan registers disposed as a scan chain about given segments of the configuration logic for providing serial scan access to, and enabling functional verification of, the configuration logic; and
      third LSSD scan registers providing interconnect scan chains disposed along the programmable interconnects, the third LSSD scan registers providing selective coupling into respective programmable interconnects for enabling serial scan access to and functional verification of the programmable interconnects.

2. An improved FPGA according to claim 1, wherein the third LSSD scan registers have primary outputs selectively coupled to respective programmable interconnects in accordance with latch configuration data retained in associated memory cells of the plurality of memory cells.

3. An improved FPGA according to claim 1, wherein the test circuitry further comprises a control register programmable via a control register portion of the boundary scan chain, said control register providing control signals for controlling certain features of the FPGA.

4. An improved FPGA according to claim 3, wherein said boundary scan chain includes a reduced scan chain configuration selectively enabled in accordance with a control signal of said control signals provided by said control register.

5. An improved FPGA according to claim 4, wherein said reduced scan chain configuration consists of said control register portion alone.

6. An improved FPGA according to claim 3, wherein said control register provides a receive inhibit control signal for selectively inhibiting select I/O functional signal lines from propagating signals of associated I/O ports into the FPGA.

7. An improved FPGA according to claim 3, wherein said control register provides a driver inhibit control signal for selectively inhibiting select I/O ports from receiving certain signals from within the FPGA.

8. An improved FPGA according to claim 3, wherein given dedicated I/O ports of said plurality of I/O ports are dedicated, as non-functional I/O ports, for receiving test enable signals; and certain other I/O ports serve, in one mode of operation, as functional I/O ports, and are selectively reconfigurable in accordance with said test enable signal to serve alternatively, in a test mode of operation, as direct inputs for receiving certain control signals of said control signals directly from outside the FPGA, instead of said certain control signals being provided indirectly via said control register and associated boundary scan chain.

9. An improved FPGA according to claim 3, wherein said control register provides receiver/driver control signals for controlling interfacing functionality between said I/O functional signal lines and associated I/O ports.

10. An improved FPGA according to claim 9, wherein given dedicated I/O ports of said plurality of I/O ports are dedicated, as non-functional I/O ports, for receiving test enable signals; and certain other I/O ports serve, in one mode of operation, as functional I/O ports for interfacing select signal lines of said I/O functional signal lines, and are selectively reconfigurable, in accordance with said test enable signals, to serve alternatively, in a test mode of operation, as direct inputs for receiving receiver/driver controls signals directly from outside the FPGA, instead of said receiver/driver control signals being provided indirectly via said control register and associated control register portion of the boundary scan chain.

11. An improved testable FPGA according to claim 1, further comprising a tester having:

means for providing a test vector;

scan means for scanning the test vector serially into the second LSSD scan registers and applying the test vector to associated segments of the configuration logic;

capture means for providing appropriate clocking for capturing result data, as effected by the configuration logic after appropriate processing of the applied test vector, into the second LSSD scan registers;

said scan means being further operative for scanning the captured data serially out of the second LSSD scan registers; and a fault detector for comparing the result data as scanned out to predetermined result data for determining functionality of the configuration logic.

12. An improved testable FPGA according to claim 1, wherein the plurality of programmable operating units are disposed across an array in rows and columns;

the plurality of programmable interconnects comprise multiple row buses and multiple column buses disposed across the array proximate respective rows and columns of the programmable operating units;

the plurality of programmable interconnects further comprise a plurality of programmable switch units that selectively subdivide select buses of the row buses and the column busses into associated bus segments in accordance with switch configuration data in designated memory cells of the plurality of memory cells;

each LSSD scan register of the third LSSD scan registers being incorporated with an associated switch unit of the plurality of programmable switch units; and the LSSD scan registers of the switch units of associated row buses and column buses establishing respective row and column interconnect scan chains.

13. A method of testing an FPGA comprising:

(a)(1) providing first LSSD scan registers as a boundary scan chain around an I/O boundary of the FPGA;

(2) applying a known I/O test vector to the I/O boundary of the FPGA;

(3) latching data of the I/O boundary as latched data into the boundary scan chain;

(4) scanning data serially out of the boundary scan chain and retrieving the latched data of the I/O boundary;

(5) comparing the retrieved data with the known I/O test vector; and (6) when the retrieved data does not correspond to the I/O test vector, reporting a fault;

(b)(1) providing second LSSD scan registers as a configuration scan chain for testing configuration logic of the FPGA, the configuration logic being operative for accessing memory cells of the FPGA in accordance with memory request signals;

(2) scanning a configuration test vector into the configuration scan chain;

(3) applying the configuration test vector of the configuration scan chain to the configuration logic;

(4) latching data, as effected by the configuration logic in response to the applied configuration test vector, into the configuration scan chain;

(5) scanning data serially out of the configuration scan chain and retrieving therefrom the data effected by the configuration logic;

(6) comparing the retrieved data with predetermined result data per the applied configuration test vector; and (7) when the retrieved data does not correspond to the predetermined result data as associated with the applied configuration test vector, reporting a fault; and (c)(1) providing third LSSD scan registers as interconnect scan chains configured within select programmable interconnects of the FPGA;

(2) configuring a first set of interconnects of the programmable interconnects of the FPGA between respective LSSD scan registers of said interconnect scan chains;

(3) scanning an interconnect test vector serially into a select input interconnect scan chain of said repeater scan chains and applying the interconnect test vector to an input side of the first set of interconnects;

(4) latching data from an output side of the first set of interconnects into a select output interconnect scan chain of said interconnect scan chains;

(5) scanning data serially out of the select output interconnect scan chain and retrieving therefrom the data as latched from the output side of the first set of interconnects;

(6) comparing the retrieved data with the interconnect test vector; and (7) when the retrieved data does not correspond to the interconnect test vector, reporting a fault.

14. A method according to claim 13, further comprising steps for testing configuration memory cells of the FPGA including:

(d)(1) writing first known data to a given memory cell of said configuration memory cells as associated with configuring a given programmable resource of the FPGA;

(2) subsequently, retrieving data from the given memory cell;

(3) comparing the retrieved data to the first known data; and (4) when the retrieved data does not correspond to the first known data, reporting a fault.

15. A method according to claim 14, further comprising a step of:

(d)(5) repeating steps (d)(1)–(d)(4) employing second known data which is the complement of the first known data.

16. A method according to claim 15, further comprising repeating steps (d)(1)–(d)(5) for each memory cell of said configuration memory cells of the FPGA.

17. A method according to claim 16, wherein each of said third LSSD scan registers includes a selective coupling means programmable, per associated configuration data in an associated memory cell of said configuration memory cells, for selectively propagating a signal between said each third LSSD scan register and its associated programmable interconnect of said programmable interconnects of the FPGA; and said step (c)(1) includes loading appropriate configuration data into memory cells of said configuration memory cells as associated with said third LSSD scan registers of the select programmable interconnects, so as to couple said third LSSD scan registers of said select input interconnect scan chain to respective input sides of said first set of interconnects.

18. A method according to claim 17, further comprising repeating steps (c)(1)–(c)(7) a plurality of times employing different associated sets of interconnects with associated select input and output interconnect scan chains for testing the various programmable interconnects of the FPGA.

19. A method according to claim 13, further comprising repeating steps (b)(1)–(b)(7), a plurality of times employing different associated configuration test vectors so as to fully exercise and test the configuration logic.

20. A method of testing a Field Programmable Gate Array, FPGA, said method comprising steps of:

(a) providing an FPGA having:

a plurality of pins;

a plurality of I/O functional signal lines associated with functional pins of said plurality of pins;

a plurality of programmable logic units providing particular logic circuits in accordance with associated logic configuration data;

a plurality of programmable interconnects for selectively interconnecting select I/O functional lines of the I/O functional signal lines and select programmable logic units of the plurality of programmable logic units in accordance with associated routing configuration data;

a plurality of memory cells, designated memory cells of the plurality of memory cells being designated to the plurality of programmable logic units and the plurality of programmable interconnects for retaining the associated logic configuration data and routing configuration data respectively;

configuration logic for accessing particular memory cells of the plurality of memory cells in accordance with memory request signals;

first LSSD scan registers disposed as a boundary scan chain across the I/O functional signal lines;

second LSSD scan registers disposed as a configuration scan chain in association with the configuration logic; and third LSSD scan registers providing interconnect scan chains disposed along select programmable interconnects of said plurality of programmable interconnects, the third LSSD scan registers being selectively coupled to respective programmable interconnects in accordance with associated latch configuration data as retained in appropriate memory cells of the plurality of memory cells;

(b) testing the various scan chains by:

(1) scanning known test data serially through each of the boundary scan chain, configuration scan chain and interconnect scan chains; and (2) comparing data scanned through said each scan chain to its associated known test data for determining functionality of said each scan chain;

(c) testing the I/O functional signal lines and associated functional pins by:

(1) passing known test data through the I/O functional signal lines between the associated functional pins and the associated first LSSD scan registers of the boundary scan chain; and (2) comparing data actually passed therethrough with the known test data for determining functionality of the I/O functional signal lines and the associated functional pins;

(d) testing the configuration logic by:

(1) scanning a test vector serially into the configuration scan chain and applying the test vector to the configuration logic;

(2) latching result data as effected by the configuration logic per the applied test vector, into the configuration scan chain as latched result data;

(3) scanning the latched result data serially out of the configuration scan chain as retrieved data; and (4) comparing the retrieved data to expected result data, as previously determined in accordance with the test vector and intended operation of the configuration logic, for determining functionality of the configuration logic; and (e) testing the programmable interconnects by:

(1) configuring a first set of interconnects of the plurality of programmable interconnects, per associated routing configuration data, for propagating data, each interconnect of the first set of interconnects having an input side and an output side;

(2) configuring a first interconnect scan chain of said interconnect scan chains, per associated repeater latch configuration data, for applying data thereof to the input sides of said first set of interconnects;

(3) providing a second interconnect scan chain for receiving data from the output sides of said first set of interconnects;

(4) scanning known test data serially into the first interconnect scan chain and applying the known test data to the input sides of said first set of interconnects;

(5) latching data presented at the output sides of said first set of interconnects into the second interconnect scan chain as latched result data;

(6) scanning data serially out of the second interconnect scan chain and recovering the latched result data as retrieved data; and (7) comparing the retrieved data to the known test data for determining functionality of the first set of interconnects.

21. A method according to claim 20, further comprising a step (f) of testing said plurality of memory cells by:

(1) writing known input data into given locations of said plurality of memory cells;

(2) reading data from the given locations of said plurality of memory cells; and (3) comparing the data as read therefrom to the known input data for determining functionality of said memory cells.

22. A method according to claim 21, wherein said step (d) preceeds step (f).

23. A method according to claim 22, wherein said step (e) follows said step (f).

* * * * *

UNITED STATES PATENT AND TRADEMARK OFFICE
CERTIFICATE OF CORRECTION

PATENT NO. : 5,867,507
DATED : Feb. 2, 1999
INVENTOR(S) : Beebe et al.

It is certified that error appears in the above-identified patent and that said Letters Patent is hereby corrected as shown below:

| | |
|---|---|
| Column 7, line 47 | Delete "it s" and insert --its-- |
| Column 7, line 48 | Delete "sub systems" and insert --subsystems-- |
| Column 8, line 6 | Begininng with SRAM14 should be indented to indicate new paragraph |

Column 9 TABLE 1

| | |
|---|---|
| line 38, column 4 | Delete "-RESET OR IO" and insert -- -RESET1 OR IO-- |
| line 39, column 4 | Delete "-RESET OR IO" and insert -- -RESET2 OR IO-- |
| line 39, column 8 | Delete " -RESET OR IO" and insert -- -RESET 2 OR IO-- |
| line 40, column 5 | Delete "&" and insert --*-- |
| line 40, column 6 | Delete " -RESET OR IO" and insert -- -RESET3 OR IO-- |
| line 40, column 8 | Delete "RESET OR IO" and insert -- -RESET3 OR IO-- |
| line 41, column 5 | Delete "&" and insert --*-- |

Signed and Sealed this

Thirteenth Day of July, 1999

Attest:

Q. TODD DICKINSON

Attesting Officer

Acting Commissioner of Patents and Trademarks